United States Patent
Higaki et al.

(10) Patent No.: US 7,491,980 B2
(45) Date of Patent: Feb. 17, 2009

(54) SEMICONDUCTOR LIGHT-EMITTING DEVICE MOUNTING MEMBER, LIGHT-EMITTING DIODE CONSTITUTING MEMBER USING SAME, AND LIGHT-EMITTING DIODE USING SAME

(75) Inventors: Kenjiro Higaki, Hyogo (JP); Sadamu Ishidu, Hyogo (JP); Teruo Amoh, Hyogo (JP); Yasushi Tsuzuki, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 432 days.

(21) Appl. No.: 10/569,095

(22) PCT Filed: Aug. 18, 2004

(86) PCT No.: PCT/JP2004/012133

§ 371 (c)(1),
(2), (4) Date: Feb. 22, 2006

(87) PCT Pub. No.: WO2005/020338

PCT Pub. Date: Mar. 3, 2005

(65) Prior Publication Data

US 2006/0220050 A1    Oct. 5, 2006

(30) Foreign Application Priority Data

Aug. 26, 2003    (JP) .............................. 2003-301788

(51) Int. Cl.
*H01L 33/00* (2006.01)
(52) U.S. Cl. .......................................... 257/99; 257/100
(58) Field of Classification Search .................... 257/79, 257/99, 100
See application file for complete search history.

(56) References Cited

U.S. PATENT DOCUMENTS 7,170,101 B2 *    1/2007    Tatsumi et al. ................ 257/94

FOREIGN PATENT DOCUMENTS

| JP | 9-321341 A | 12/1997 |
|----|-----------|---------|
| JP | 11-220178 A | 8/1999 |
| JP | 2000-208821 A | 7/2000 |
| JP | 2001-144333 | 5/2001 |
| JP | 2001-332769 A | 11/2001 |
| JP | 2001-345481 A | 12/2001 |
| JP | 2002-232017 A | 8/2002 |

(Continued)

*Primary Examiner*—Thien F Tran
(74) *Attorney, Agent, or Firm*—Venable LLP; Michael A. Sartori; Justine A. Gozzi

(57) ABSTRACT

A semiconductor-light-emitting-device-mounting member BL comprises (a) a highly heat-dissipative member 1 having a main surface 10 on which connecting-use electrode layers 41 and 42 are provided to form a device-mounting area 10a and (b) a frame-shaped member 2 placed on the main surface 10 so as to surround the device-mounting area 10a. The device-mounting area 10a has an area that is 1.05 to 4 times the area of a semiconductor light-emitting device LE1. A light-emitting-diode-constituting member LE2 mounts a semiconductor light-emitting device LE1 on the device-mounting area 10a of the semiconductor-light-emitting-device-mounting member BL and has a fluorescent body and/or a protective resin LR filling the inside space of the frame-shaped member 2. A light-emitting diode LE3 mounts the light-emitting-diode-constituting member LE2 on a package 7.

15 Claims, 11 Drawing Sheets

FOREIGN PATENT DOCUMENTS

| | | |
|---|---|---|
| JP | 2002-344020 A | 11/2002 |
| JP | 2003-37298 A | 2/2003 |
| JP | 2003-110148 A | 4/2003 |
| JP | 2003-124521 A | 4/2003 |
| JP | 2003-197974 A | 7/2003 |

* cited by examiner

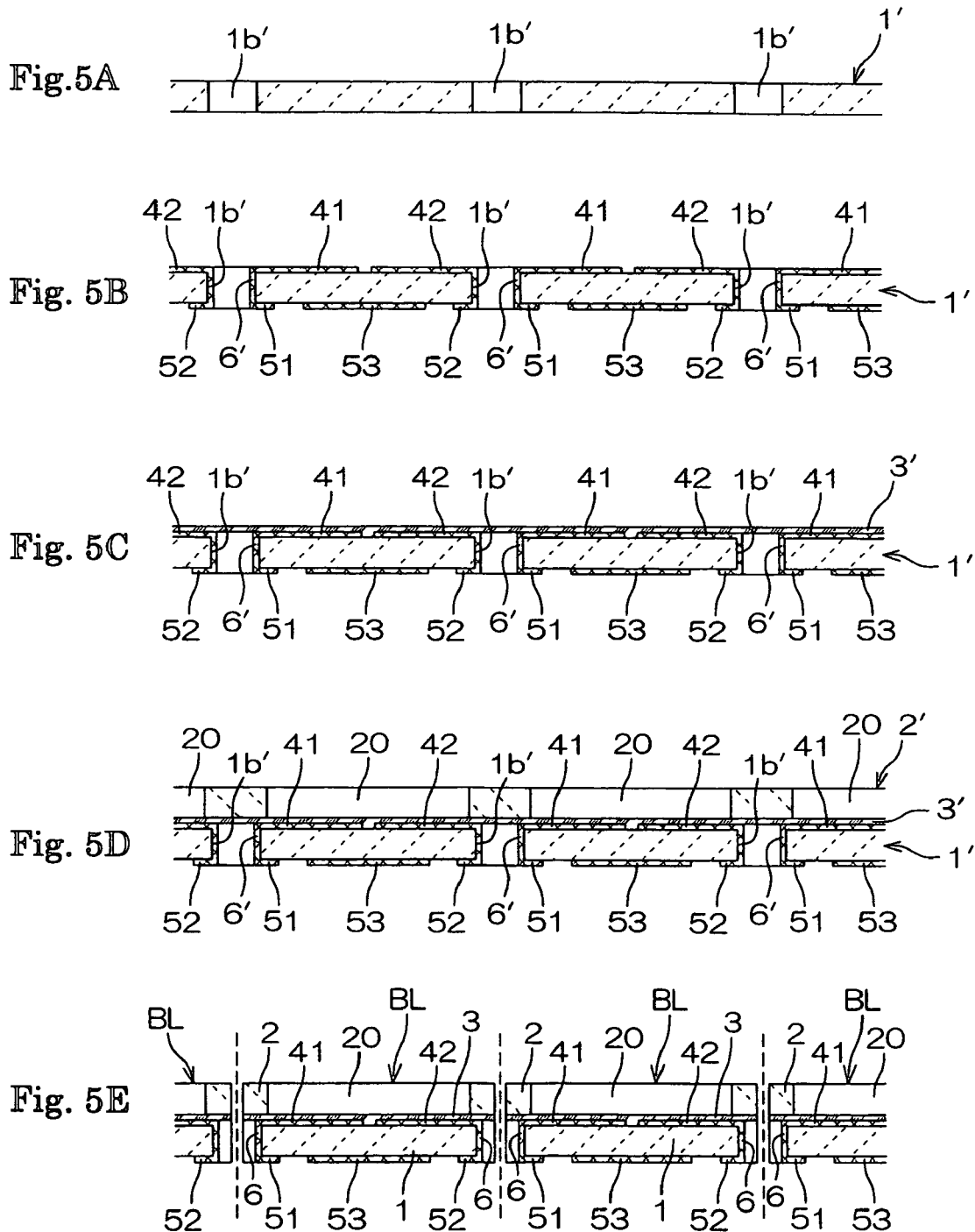

SEMICONDUCTOR LIGHT-EMITTING DEVICE MOUNTING MEMBER, LIGHT-EMITTING DIODE CONSTITUTING MEMBER USING SAME, AND LIGHT-EMITTING DIODE USING SAME

TECHNICAL FIELD

The present invention relates to a semiconductor-light-emitting-device-mounting member to be used to form a light-emitting diode by using a semiconductor light-emitting device, a light-emitting-diode-constituting member that mounts a semiconductor light-emitting device on the semiconductor-light-emitting-device-mounting member, and a light-emitting diode that mounts the light-emitting-diode-constituting member on it.

BACKGROUND ART

When a light-emitting diode is formed by using a chip-shaped semiconductor light-emitting device in which a light-emitting layer and an electrode layer are formed on a semiconductor substrate, it is a common practice to use a package having a recessed portion (see Literature 1: the published Japanese patent application 2002-232017). The package described in Literature 1 uses the bottom surface of the recessed portion as a mounting portion for mounting a semiconductor light-emitting device to allow light emitted from the semiconductor light-emitting device to emerge from the opening of the recessed portion to the outside.

In the package of Literature 1 above, to increase the luminous efficiency of the light-emitting diode, not only is the recessed portion formed to have a shape extending toward outside from the bottom surface to the opening (a conical shape) but also the inner surface of the recessed portion is covered with a metal layer capable of reflecting the light emitted from the semiconductor light-emitting device.

A light-emitting diode is produced by the following process. First, a semiconductor light-emitting device is mounted on the mounting portion of the package. The recessed portion is filled with a fluorescent body and/or protective resin to seal the semiconductor light-emitting device. The opening is closed with a sealing cap or lens as required.

On the other hand, a surface light-emitting body is formed by the following process. First, a plurality of mounting portions for mounting a semiconductor light-emitting device are formed on one substrate. A semiconductor light-emitting device is mounted on each of the mounting portions. The semiconductor light-emitting devices are sealed with a fluorescent body and/or protective resin. (see Literature 2: the published Japanese patent application 2001-332769).

In the case of a semiconductor light-emitting device, it is difficult to distinguish a satisfactory device from an unsatisfactory device at the stage of a chip. Consequently, in the case of a light-emitting diode, it is a common practice to employ the following procedure. First, the semiconductor light-emitting device is mounted on the mounting portion of the package using adhesive or solder and electrically connected with wire bonding or another means. Subsequently, a quality examination test is performed to see whether the device emits light or not, the emitted light has a specified wavelength or not, and so on.

In particular, in the case of, for example, a white-light-emitting diode that achieves white light by combining a semiconductor light-emitting device for emitting light having a specified wavelength and a fluorescent body, it is a common practice to employ the above-described procedure. That is, first, the semiconductor light-emitting device is mounted on the mounting portion of the package. Then, the recessed portion of the package is filled with a specified quantity of a fluorescent body. Subsequently, a quality examination test is performed to see whether the device emits light or not, the emitted light has a specified shade of color or not, and so on.

As a result, if the semiconductor light-emitting device is unsatisfactory so that it does not emit light at all or it cannot emit specified light because the light has a largely deviated wavelength, the used package and fluorescent body become wasted completely, which is a problem.

In addition, when the semiconductor light-emitting device is mounted on the package, unsatisfactory wiring may occur and the device may be broken due to static electricity, heat, or the like. If these faults occur, the used package and fluorescent body also become wasted completely, which is another problem.

In particular, in recent years, to increase the luminous efficiency of a light-emitting diode, it has been becoming a common practice to use a package having a complex structure as described in Literature 1 above or to use a costly highly heat-dissipative member in a package to respond to the increase in the output of a light-emitting diode. Consequently, when a package becomes a waste, a large amount of economical loss will be caused, which is a problem.

The production of a surface light-emitting body, also, suffers a similar problem. More specifically, it is a common practice to employ the following procedure. First, the semiconductor light-emitting device is mounted on the mounting portion of the substrate using adhesive, solder, or the like and electrically connected with wire bonding or another means. Subsequently, a quality examination test is performed to see whether the device emits light or not, the emitted light has a specified wavelength or not, and so on.

In particular, in the case of a white-surface-light-emitting body that achieves white light by combining a semiconductor light-emitting device for emitting light having a specified wavelength and a fluorescent body, it is a common practice to employ the following procedure. First, a plurality of semiconductor light-emitting devices are mounted on the substrate as described above. Second, each semiconductor light-emitting device is sealed with a specified quantity of a fluorescent body. Then, a quality examination test is performed to see whether the device emits light or not, the emitted light has a specified shade of color or not, and so on.

Consequently, even if one of the multiple semiconductor light-emitting devices mounted on the substrate becomes unsatisfactory, i.e., it does not emit light or it cannot emit the specified white light because the light has a deviated wavelength, all the following components become wasted: all the other semiconductor light-emitting devices, the fluorescent bodies used for sealing the individual semiconductor light-emitting devices, and the substrate on which the circuit for driving the individual semiconductor light-emitting devices is formed. As a result, a large amount of economical loss will be caused, which is a problem.

In addition, it is unavoidable for individual semiconductor light-emitting devices to emit light having a deviated wavelength. Therefore, it is ideal to select the multiple semiconductor light-emitting devices to be used in the same surface light-emitting body in advance so that the variation in wavelength of the light they emit can be minimized to obtain a uniform property. However, as described above, it is difficult to examine the wavelength of the light emitted from conventional semiconductor light-emitting devices. As a result, the variation in the shade of color tends to be produced in the light emitted from a surface light-emitting body, which is another problem.

Furthermore, the package described in Literature 1 is formed by the cofire method, whose process is explained below. First, a ceramic green sheet is prepared as the starting material of the ceramic material for forming the package. The ceramic green sheet is provided with a recessed portion, via, through hole, and the like. Subsequently, the above-described metal layer, the metalized layer to be used as an electrode layer for mounting the device, the via, the through hole, and so on are formed in a specified shape using an electrically conductive paste containing a high-melting-point metal, such as Mo and W. Finally, the entire formed body is sintered.

In the cofire method, however, when sintered at high temperature, the ceramic green sheet shrinks. Therefore, it is difficult to form the via, through hole, metalized layer, and the like with high precision. In particular, a small package and a package having a minute metalized pattern cannot be produced with high yield, which is a problem.

In addition, the metallic layer and electrode layer are structured by stacking a surface layer having good reflectivity to light and good electrical conductivity on the metalized layer using the plating method. In this case, an aluminum surface layer is particularly suitable as the surface layer for the metal layer because it has good reflectivity to the light having a short wavelength suitable for producing white light by combining with a fluorescent body. However, it is difficult to form the aluminum surface layer on the metalized layer by the plating method, which is another problem.

DISCLOSURE OF INVENTION

An object of the present invention is to offer a semiconductor-light-emitting-device-mounting member capable of eliminating the waste of a costly package, a semiconductor light-emitting device, a substrate, a fluorescent body, and so on. This capability is to be given by the ability to examine the presence or absence of a faulty property of the semiconductor light-emitting device and the shade of color of the light before the light-emitting device is incorporated into the light-emitting diode or surface light-emitting body.

Another object of the present invention is to offer a light-emitting-diode-constituting member that uses the foregoing semiconductor-light-emitting-device-mounting member.

Yet another object of the present invention is to offer a light-emitting diode that can be produced at lower cost and high productivity with preventing the occurrence of a large amount of economical loss due to the waste of the package and other components. This capability is to be given by the use of the foregoing light-emitting-diode-constituting member.

A semiconductor-light-emitting-device-mounting member of the present invention comprises:
(a) a highly heat-dissipative member that has:
  (a1) a one side, referred to as a main surface, on which at least two mutually insulated electrode layers to be connected with a semiconductor light-emitting device are formed to provide a device-mounting area for mounting the semiconductor light-emitting device; and
  (a2) the opposite side, which is referred to as an outside-connecting surface to be connected with another member; and
(b) a frame-shaped member placed on the main surface of the highly heat-dissipative member bonded with each other through at least one resin-based adhesive layer to form a unified body so as to surround the device-mounting area.

In the above semiconductor-light-emitting-device-mounting member, the highly heat-dissipative member has a thermal conductivity of at least 10 W/mK and a coefficient of thermal expansion of at most $10 \times 10^{-6}/°$ C., and the device-mounting area has an area that is 1.05 to 4 times the area of the semiconductor light-emitting device to be mounted.

The above-described semiconductor-light-emitting-device-mounting member of the present invention has a device-mounting area that has an area in the range of 1.05 to 4 times the area of the semiconductor light-emitting device to be mounted. This means that the mounting member is only about one-size larger than the chip size of the semiconductor light-emitting device. Still, the mounting member has a function similar to that of conventional packages.

More specifically, the semiconductor-light-emitting-device-mounting member of the present invention has the highly heat-dissipative member that has a thermal conductivity of at least 10 W/mK. Therefore, it has an excellent heat-dissipating property for responding to the increase in the output of a light-emitting diode.

Furthermore, the semiconductor-light-emitting-device-mounting member of the present invention has the highly heat-dissipative member that has a coefficient of thermal expansion of at most $10 \times 10^{-6}/°$ C. In particular, the mounting member has a coefficient of thermal expansion close to that of the semiconductor light-emitting device having a semiconductor substrate. Therefore, it can prevent the semiconductor light-emitting device from cracking and the bonding with the electrode layer from breaking to cause faulty bonding when an excessive stress is applied to the device at the time of the expansion or contraction of the highly heat-dissipative member caused by the heat history due to the emission of light, for example.

In addition, the semiconductor-light-emitting-device-mounting member of the present invention has a function of (a) mounting a semiconductor light-emitting device, through the device-mounting-use electrode layers, on the device-mounting area formed by providing the electrode layers on the main surface of the highly heat-dissipative member and (b) allowing the device to emit light by electrically connecting the device to the outside circuit.

Furthermore, the semiconductor-light-emitting-device-mounting member of the present invention can seal the semiconductor light-emitting device in the inside space of the frame-shaped member, provided on the main surface so as to surround the device-mounting area, by filling the inside space with a fluorescent body and/or protective resin.

Consequently, by (a) mounting the semiconductor light-emitting device on the device-mounting area of the semiconductor-light-emitting-device-mounting member of the present invention and (b) sealing the device through the filling of the inside space of the frame-shaped member with a fluorescent body and/or protective resin, as described above, the light-emitting-diode-constituting member of the present invention can be constituted that is only about one-size larger than the chip size of the semiconductor light-emitting device.

The light-emitting-diode-constituting member can be handled as a component part as with a chip of a conventional semiconductor light-emitting device. For example, it can be incorporated into a package of a light-emitting diode and be mounted on the substrate of a surface light-emitting body.

Before the foregoing light-emitting-diode-constituting member is incorporated into a package of a light-emitting diode or mounted on the substrate of a surface light-emitting body, by feeding a current to the mounted semiconductor light-emitting device through the electrode layers in advance, a quality examination test can be performed to see whether the device emits light or not, the emitted light has a specified wavelength or not, and so on. In the case of white-light emission, the shade of color of the emitted light can be examined in a state where the device is sealed with the fluorescent body.

Consequently, the light-emitting diode and surface light-emitting body can selectively use only the light-emitting-diode-constituting member mounting a good semiconductor light-emitting device. As a result, the waste of a costly package and the like can be prevented to an extent possible.

In the case of a surface light-emitting body that emits white light, the shade of color of the light emitted from a plurality of light-emitting-diode-constituting members can be examined in advance to selectively use light-emitting-diode-constituting members having a minimum variation in the shade of color. Therefore, a surface light-emitting body can be easily produced that has a uniform shade of color in the emitted light.

In the case of a light-emitting diode, conventionally, it is necessary to fill the recessed portion of a package, considerably larger than the semiconductor light-emitting device, with a large quantity of a fluorescent body and/or protective resin. On the other hand, in the semiconductor-light-emitting-device-mounting member of the present invention, only the frame-shaped member's small inside space, having a size similar to the chip size of the semiconductor light-emitting device, needs to be filled with a fluorescent body and/or protective resin. Therefore, the waste of these materials can be eliminated advantageously.

In addition, the semiconductor-light-emitting-device-mounting member of the present invention has a structure in which the highly heat-dissipative member and the frame-shaped member are bonded with each other through at least one resin-based adhesive layer to form a unified body. Therefore, it can be produced by bonding the following two ceramic plates through a bonding layer to unify them and then cutting the unified body into individual pieces having a specified shape when viewed from above:

(a) a previously sintered ceramic plate that is used as the starting material for producing highly heat-dissipative members and that is provided with electrode layers and connecting layers, as required, on its top face, on its back face, in through holes for forming parts of side faces of the highly heat-dissipative members, and so on, and (b) another previously sintered ceramic plate that is used as the starting material for producing frame-shaped members, that is provided with, at specified positions, through holes each to be used as an area surrounded by a frame-shaped member, and that is provided with electrode layers and connecting layers, as required, on its toy face, on its back face, in through holes for forming parts of side faces of the frame-shaped members, and so on.

Consequently, the electrode layers and connecting layers can be formed with high precision on the surface of a previously sintered ceramic plate or the like by using photolithography or another technique. Therefore, they can be pattern-formed with a minute shape of at most 100 μm.

More specifically, minute electrode layers and connecting layers can be formed with higher precision that have a magnitude of at most 100 μm, more desirably at most 50 μm, in the following features: a gap between patterns, a pattern width, the minimum value in the two-dimensional shape of the pattern, and so on. Consequently, the semiconductor light-emitting device can be mounted on the device-mounting area by the flip-chip mounting method or another method to effectively dissipate the heat generated at the light-emitting portion of the semiconductor light-emitting device by effectively transferring the heat to the highly heat-dissipative member. As a result, the output of the semiconductor light-emitting device can be further increased.

In addition, as described above, an aluminum electrode layer, which has good reflectivity to light having a short wavelength, in particular, can be formed on the highly heat-dissipative member. In the above description, the aluminum electrode layer has been known as a layer difficult to form as a surface layer by the plating method on a metalized layer that is made of Mo, W, or the like and that is formed by the cofire method.

Considering (a) the space-saving by minimizing the outside dimensions of the semiconductor-light-emitting-device-mounting member and (b) the elimination of the waste of material by decreasing the costly highly heat-dissipative member used to the smallest possible quantity, it is desirable that the device-mounting area have an area that is at most 3 times the area of the semiconductor light-emitting device to be mounted.

Considering the improvement of the workability when the semiconductor light-emitting device is mounted on the device-mounting area, it is desirable that the device-mounting area have an area that is at least 1.1 times the area of the semiconductor light-emitting device to be mounted.

Considering (a) the space-saving by minimizing the outside dimensions of the semiconductor-light-emitting-device-mounting member and (b) the improvement of the workability when the semiconductor light-emitting device is mounted with minimizing the waste of material, it is desirable that the highly heat-dissipative member have an area that is 1.5 to 10 times the area of the semiconductor light-emitting device to be mounted, more desirably 2 to 7 times.

To cause a semiconductor light-emitting device to emit light by mounting it on the semiconductor-light-emitting-device-mounting member, it is desirable that the wiring that connects the connecting-use electrode layers provided on the main surface of the highly heat-dissipative member to the outside circuit (a) be constituted by an electrode layer or connecting layer having the shape of a layer and (b) have one of the following structures headed by the numbers (1) to (3):

(1) (a) The outside-connecting surface is provided with at least two mutually insulated electrode layers for connecting with other members, and (b) each of the at least two mutually insulated electrode layers on the outside-connecting surface is connected individually to each of the at least two mutually insulated electrode layers on the main surface through a connecting layer formed on a side face of the highly heat-dissipative member or on an inner face of a through hole penetrating through the highly heat-dissipative member.

(2) (a) The main surface of the highly heat-dissipative member is provided with areas, for connecting with other members, at the outside of the frame-shaped member, and (b) each of the at least two electrode layers on the main surface is extended to one of the areas so as to be used also as an electrode layer for connecting with another member.

(3) (a) The frame-shaped member has a top surface that is provided with at least two mutually insulated electrode layers for connecting with other members, and (b) each of the at least two mutually insulated electrode layers on the top surface of the frame-shaped member is connected individually to each of the at least two mutually insulated electrode layers on the main surface through a connecting layer formed on a side face of the frame-shaped member or on an inner face of a through hole penetrating through the frame-shaped member.

These electrode layers and connecting layers can be formed with high precision and at low cost by utilizing the technique established in the production of semiconductor devices and printed circuit board. In addition, because they resist to break unlike wire bonding, the occurrence of faulty connection and the like can be prevented to an extent possible when the semiconductor light-emitting device is mounted on the semiconductor-light-emitting-device-mounting member and the device is sealed with a fluorescent body, protective resin, or the like.

When the structure headed by (2) is employed, the electrode layers need to be formed only on the main surface of the highly heat-dissipative member. Consequently, the structure of the wiring can be simplified, further reducing the cost.

On the other hand, when the structures headed by (1) and (3) are employed, it is not necessary to provide areas for connecting with other members at places which are located at the outside of the frame-shaped member on the main surface of the highly heat-dissipative member. Consequently, the outside dimensions of the semiconductor-light-emitting-device-mounting member can be minimized to enable the space saving.

Furthermore, in the structure headed by (2), the electrode layers that are for connecting with other members and that are provided on the outside-connecting surface of the highly heat-dissipative member can be connected with the electrode layers provided on the mounting portion of the package of the light-emitting diode or of the substrate of the surface light-emitting body by soldering. Consequently, the mounting of the semiconductor-light-emitting-device-mounting member and the electrical connection can be performed concurrently, which is referred to as the surface mounting. Thus, this structure is advantageous in simplifying the process and structure for mounting the member on the package or substrate.

In the case of the surface mounting, considering the sufficient securing of the heat-dissipating path between the highly heat-dissipative member and other members such as the package and substrate, it is desirable that the percentage of the sum of the areas of the electrode layers provided on the outside-connecting surface account for at least 30%, more desirably at least 50%, of the area of the outside-connecting surface.

The frame-shaped member may be formed of various materials. However, as described above, in a state in which the frame-shaped member is bonded with the highly heat-dissipative member to form a unified body, considering the prevention of the occurrence of the warpage in the laminated body of the two members, it is desirable that the frame-shaped member have a coefficient of thermal expansion closest possible to that of the highly heat-dissipative member. More specifically, it is desirable that the frame-shaped member have a coefficient of thermal expansion of at most $10 \times 10^{-6}/^\circ C.$ and that the difference in coefficient of thermal expansion between the frame-shaped member and the highly heat-dissipative member be at most $3 \times 10^{-6}/^\circ C.$ Considering (a) decreasing, to an extent possible, the amount of absorption and reflection of the light from the semiconductor light-emitting device by the frame-shaped member, (b) facilitating the designing of the spread of light when the semiconductor-light-emitting-device-mounting member is mounted on the mounting portion of a package in a light-emitting diode or of the substrate of a surface light-emitting body, and (c) thereby increasing the luminous efficiency of the light-emitting diode and surface light-emitting body, it is desirable that the frame-shaped member be formed of a material capable of transmitting the light from the semiconductor light-emitting device.

When the frame-shaped member is provided with a reflective layer on its surface to be bonded with the highly heat-dissipative member, the luminous efficiency of the light-emitting diode and surface light-emitting body can be further increased.

A light-emitting-diode-constituting member of the present invention comprises:
  (a) a semiconductor-light-emitting-device-mounting member described above,
  (b) a semiconductor light-emitting device mounted on the device-mounting area of the main surface of the highly heat-dissipative member, the device-mounting area being surrounded by the frame-shaped member, and
  (c) at least one of a fluorescent body and a protective resin filling the inside space of the frame-shaped member to seal the semiconductor light-emitting device.

The foregoing light-emitting-diode-constituting member of the present invention can be handled, as described above, in a way similar to the way a chip of a conventional semiconductor light-emitting device is handled. For example, it can be mounted on a mounting portion of the package of a light-emitting diode and of the substrate of a surface light-emitting body. In addition, it has an excellent feature in that before it is mounted on these mounting portions, the quality examination test of the semiconductor light-emitting device and the shade of color of the emitted light can be performed in advance. Furthermore, it is not necessary to directly touch the semiconductor light-emitting device during the mounting operation, for example. Therefore, it is possible to suppress to a minimum the occurrence of the breakage of the device due to static electricity, for example.

A light-emitting diode of the present invention comprises:
  (a) a package provided with a recessed portion having a bottom surface and an opening,
  (b) a light-emitting-diode-constituting member described above that is mounted on the bottom surface of the recessed portion, and
  (c) a sealing cap or lens that is made of a material capable of transmitting the light from the light-emitting-diode-constituting member and that seals the opening of the recessed portion.

The foregoing light-emitting diode of the present invention has an excellent feature in that it can be produced with high efficiency without wasting a costly package and the like.

BRIEF DESCRIPTION OF DRAWINGS

FIGS. 5A to 5E are each a cross-sectional view showing an example of the process for producing the semiconductor-light-emitting-device-mounting member of the above-described example.

BEST MODE FOR CARRYING OUT THE INVENTION

Figure 1:
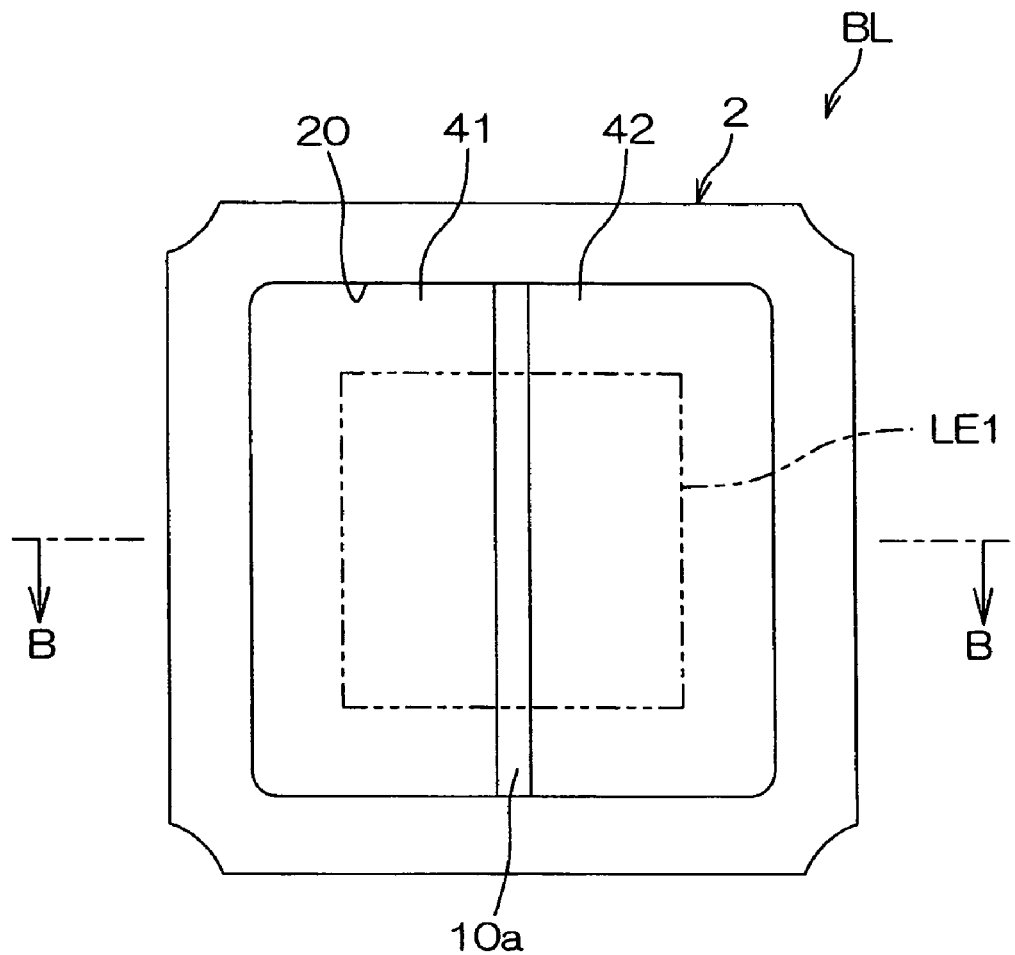
FIG. 1 is a plan view showing an example of an embodiment of a semiconductor-light-emitting-device-mounting member of the present invention.
Figure 2:
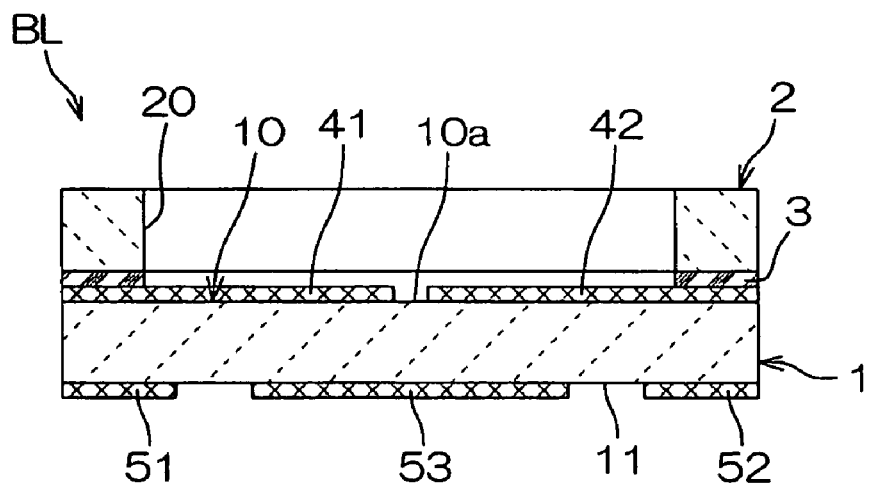
FIG. 2 is a view showing the cross section cut by the line B-B in FIG. 1.
Figure 3:
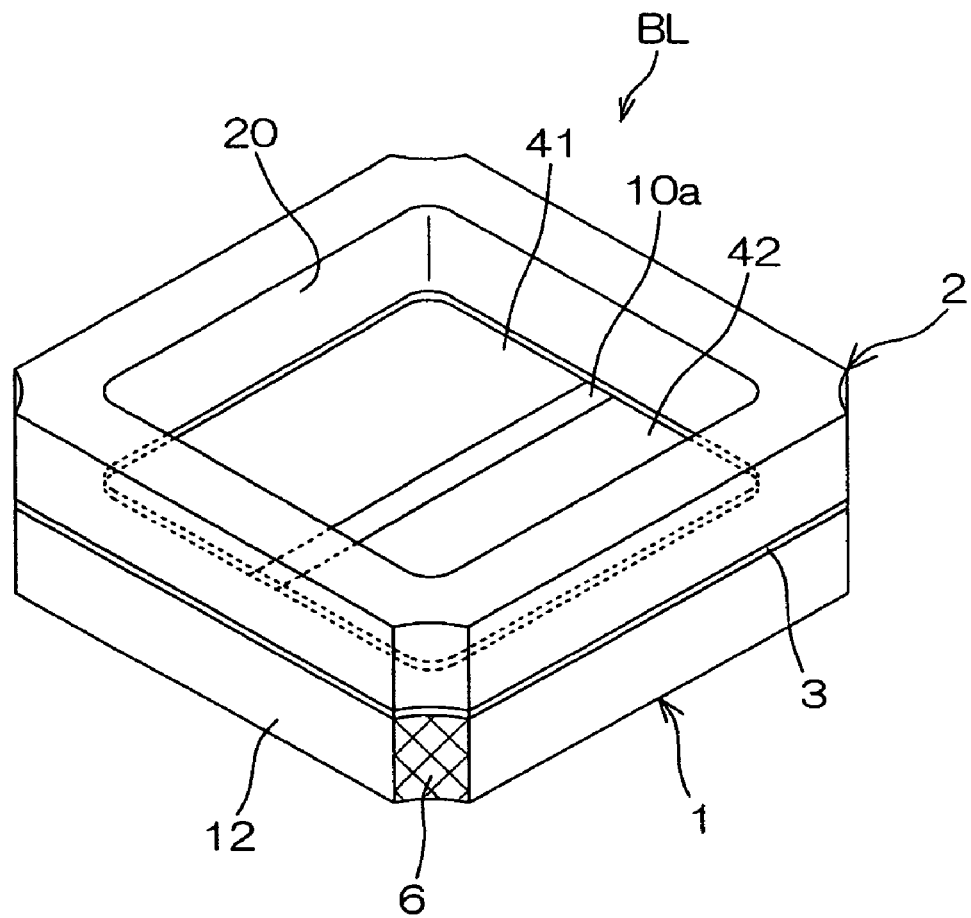
FIG. 3 is a perspective view showing the entire semiconductor-light-emitting-device-mounting member of the above-described example.
Figure 4:
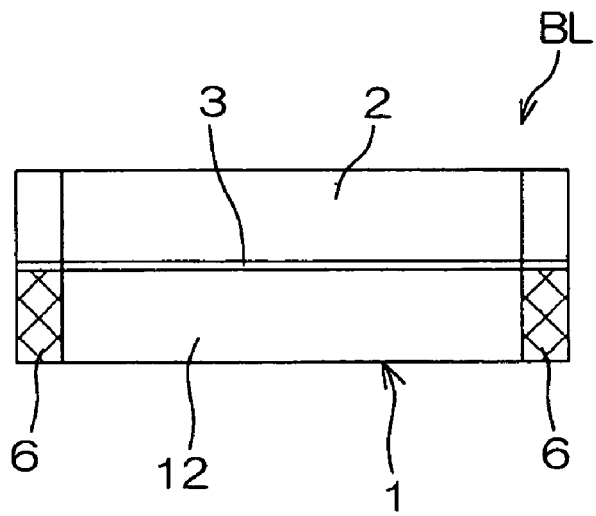
FIG. 4 is a side view showing the semiconductor-light-emitting-device-mounting member of the above-described example.

FIG. 1 is a plan view showing an example of an embodiment of a semiconductor-light-emitting-device-mounting member BL of the present invention. FIG. 2 is a view showing the cross section cut by the line B-B in FIG. 1. FIG. 3 is a perspective view showing the entire semiconductor-light-emitting-device-mounting member BL of the above-described example. FIG. 4 is a side view of it.

As can be seen from these figures, the semiconductor light-emitting-device-mounting member BL of this example is provided with a flat-shaped highly heat-dissipative member 1 that has a nearly square shape when viewed from above and that has a main surface 10, which is the top surface in the foregoing figures. A frame-shaped member 2, whose outside wall runs along with the four sides of the square of the highly heat-dissipative member 1, is placed on the main surface 10 as a component of the member BL.

In this example, the frame-shaped member 2, which has a flat shape similar to that of the highly heat-dissipative member 1, has a nearly square through hole 20 at its center portion. The main surface 10 of the highly heat-dissipative member 1 has a device-mounting area 10a for mounting a semiconductor light-emitting device LE1 shown by a chain double-dashed line in FIG. 1. The device-mounting area 10a is exposed to the outside through the through hole 20 and is surrounded by the frame-shaped member 2. The opposite surface of the highly heat-dissipative member 1 is referred to as an outside-connecting surface 11, which is used to connect with another member.

In this example, the semiconductor-light-emitting-device-mounting member BL has a frame-shaped member placed on the main surface of the highly heat-dissipative member bonded with each other through at least one resin-based adhesive layer to form a unified body.

The main surface 10 of the highly heat-dissipative member 1 is provided with two electrode layers 41 and 42, which are mutually insulated with a narrow gap provided at the center of the main surface 10. The semiconductor light-emitting device LE1 is to be mounted on the electrode layers 41 and 42.

Figure 7:
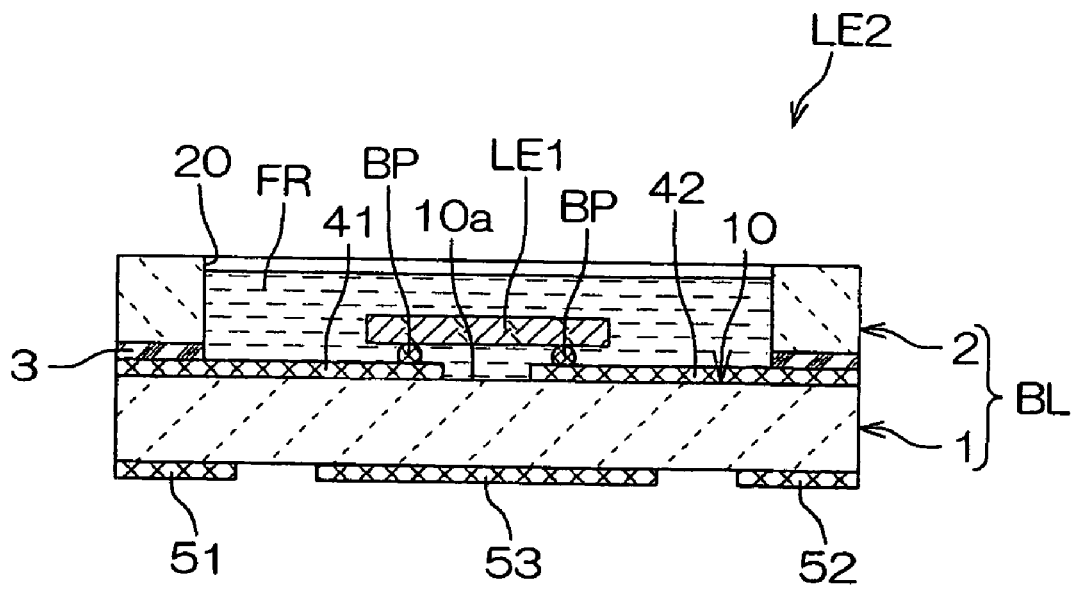
FIG. 7 is a cross-sectional view showing an example of a light-emitting-diode-consulting member formed by using the semiconductor-light-emitting-device-mounting member of the above-described example.

The two electrode layers 41 and 42 correspond individually to the two electrodes of the semiconductor light-emitting device LE1 and, as shown in FIG. 7, are bonded with the two electrodes of the semiconductor light-emitting device LE1 through gold bumps BP. After the semiconductor light-emitting device LE1 is mounted on the device-mounting area 10a by the foregoing bonding, the inside space of the frame-shaped member 2 is filled with a fluorescent body and/or a protective resin FR to seal the semiconductor light-emitting device LE1. Thus, a light-emitting-diode-constituting member LE2 shown in FIG. 7 can be obtained.

In this example, as shown in FIGS. 1 and 3, the two electrode layers 41 and 42 are formed on nearly the entire device-mounting area 10a, except the gap portion, to function as a reflective surface for upwardly reflecting the light from the semiconductor light-emitting device LE1.

The outside-connecting surface 11 of the highly heat-dissipative member 1 is provided with three electrode layers 51 to 53, which are mutually insulated with two gaps and are used to connect with other members.

The highly heat-dissipative member 1 has a square side face 12 whose four corners are each chamfered to form a connecting layer 6, as shown by a mesh pattern in FIGS. 3 and 4.

The electrode layer 41 at one side of the highly heat-dissipative member 1 is connected with the electrode layer 51 at the other side through two connecting layers 6. The electrode layers 42 and 52 are mutually connected by a similar method. More specifically, the electrode layers 41 and 51 are mutually connected through two connecting layers 6 formed on the two chamfers closer to them. The electrode layers 42 and 52 are mutually connected through the remaining two connecting layers 6 formed on the two chamfers closer to them.

Figure 8:
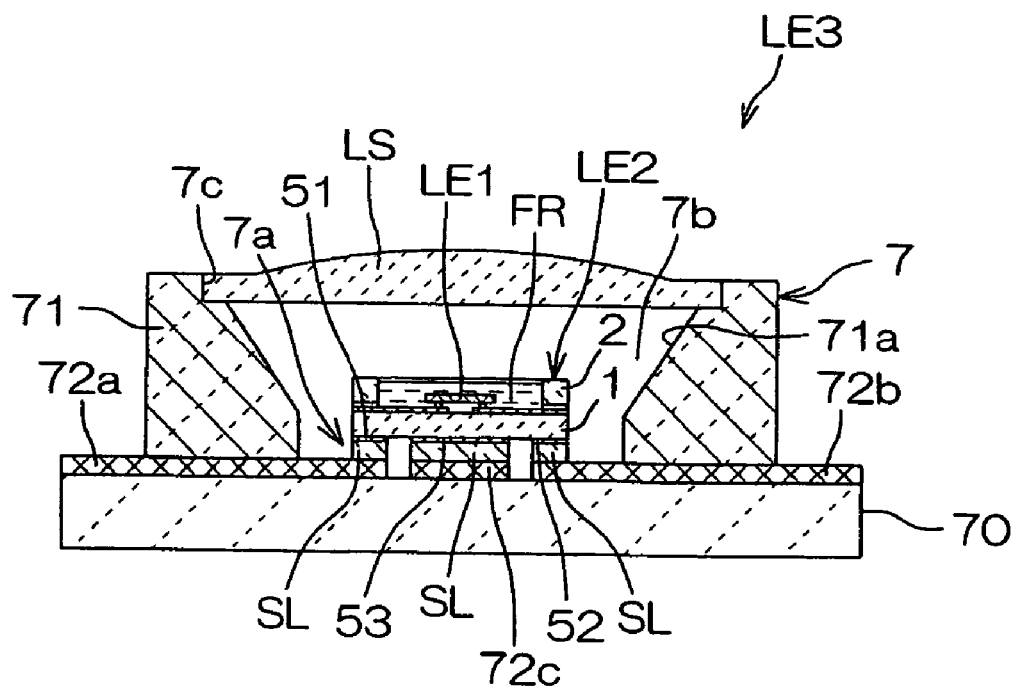
FIG. 8 is a cross-sectional view showing an example of a light-emitting diode constituted by using the light-emitting-diode-constituting member of the above-described example.

As shown in FIG. 8, the electrode layers 51 and 52 correspond to two lead-use electrode layers 72a and 72b provided on the mounting portion 7a of the package 7 of a light-emitting diode LE3. They are soldered with the two electrode layers 72a and 72b through soldering layers SL. Thus, the electrode layers 51 and 52 perform the function of mounting the light-emitting-diode-constituting member LE2 on the mounting portion 7a of the package 7 by the earlier-described surface mounting.

The central electrode layer 53 situated between the electrode layers 51 and 52 is fixed to an electrode layer 72c situated between the electrode layers 72a and 72b through another soldering layer SL, as with the electrode layers 51 and 52, at the time of the surface mounting. Thus, the electrode layer 53 performs mainly the function of securing the heat-dissipating path between the highly heat-dissipative member 1 and the package 7 or the like.

Considering the sufficient securing of the above-described heat-dissipating path between the highly heat-dissipative member 1 and the package 7 or the like, it is desirable that the percentage of the sum of the areas of the electrode layers 51 to 53 account for at least 30% of the outside-connecting surface 11, more desirably at least 50%, preferably at least 70%, as described earlier.

As described above, the semiconductor-light-emitting-device-mounting member BL of this example comprises various components. Among the components, the highly heat-dissipative member 1 is required to have a thermal conductivity of at least 10 W/mK and a coefficient of thermal expansion of at most $10 \times 10^{-6}/°$ C., as described earlier.

If the highly heat-dissipative member 1 has a thermal conductivity less than 10 W/mK, the heat-dissipating capability is insufficient. As a result, the mounted semiconductor light-emitting device LE1 degrades and breaks prematurely due to the heat generated by itself at the time of the light emission.

On the other hand, if the highly heat-dissipative member 1 has a coefficient of thermal expansion more than $10 \times 10^{-6}/°$ C., the difference in the coefficient of thermal expansion with the semiconductor light-emitting device LE1 becomes excessively large. Consequently, when the highly heat-dissipative member 1 expands or contracts, an excessive stress will be applied to the semiconductor light-emitting device LE1, for example. As a result, the semiconductor light-emitting device LE1 may crack or the bonding with the electrode layers 41 and 42 through the gold bumps BP may be broke to cause faulty bonding. In the above description, the expansion or contraction of the highly heat-dissipative member 1 occurs due to the following causes, for example: (a) the heat history given by the soldering or a similar operation when the semiconductor light-emitting device LE1 is mounted on the device-mounting area 10a and when the light-emitting-diode-constituting member LE2 is mounted on the mounting portion 7a of the package 7 and (b) the heat generated by the semiconductor light-emitting device LE1 at the time of the light emission.

The types of the material that can be used to form the highly heat-dissipative member 1 satisfying the above-described specification include insulating ceramic materials, such as AlN, $Al_2O_3$, SiC, $Si_3N_4$, BeO, and BN. Of these, $Al_2O_3$ is desirable with respect to cost.

However, considering the heat-dissipative property, it is desirable that the highly heat-dissipative member 1 have a thermal conductivity that not only falls within the foregoing range but also falls within the range of at least 150 W/mK, more desirably at least 200 W/mK. To achieve such a high thermal conductivity, it is desirable to use AlN or SiC. Furthermore, considering the decreasing of the difference in the coefficient of thermal expansion with the semiconductor light-emitting device LE1, it is desirable to use AlN or $Al_2O_3$.

Consequently, when the highest priority is given, for example, to the heat-dissipative function to respond to the increase in the output of a light-emitting diode, of the above-described materials, it is particularly desirable to use AlN to form the highly heat-dissipative member 1. When the priority of the heat-dissipative function is low, it is desirable to use $Al_2O_3$ to form the highly heat-dissipative member 1.

Nevertheless, considering the balance with other physical properties of the highly heat-dissipative member 1, such as mechanical strength, or the production cost, for example, it is desirable that the above-described ceramic material have a thermal conductivity that not only falls within the foregoing range but also falls within the range of at most 300 W/mK, in particular, and a coefficient of thermal expansion that not only falls within the foregoing range but also falls within the range of $4 \times 10^{-6}$ to $7 \times 10^{-6}/°$ C., in particular.

In the highly heat-dissipative member 1, the device-mounting area 10a surrounded by the frame-shaped member 2 is required to have an area that is 1.05 to 4 times the area of the semiconductor light-emitting device LE1 to be mounted.

If the device-mounting area 10a has an area that is more than 4 times the area of the semiconductor light-emitting device LE1, the semiconductor-light-emitting-device-mounting member BL becomes excessively large. As a result, the waste of the material produced due to a faulty semiconductor light-emitting device LE1 becomes nearly the same as in the case of conventional packages, which is a problem.

In particular, because the highly heat-dissipative member 1 is costly, it is desirable that its area not only fall within the foregoing range but also be smallest possible. More specifically, considering the elimination of the waste of the material, it is desirable that the device-mounting area 10a have an area that not only falls within the foregoing range but also falls within the range of at most 3 times the area of the semiconductor light-emitting device LE1, more desirably at most 2.5 times.

In addition, if the device-mounting area 10a has an area that is less than 1.05 times the area of the semiconductor light-emitting device LE1, the area of the device-mounting area 10a becomes excessively small. As a result, the mounting operation of the semiconductor light-emitting device LE1 may become difficult.

Considering the improvement of the workability of the mounting operation, it is desirable that the device-mounting area 10a have an area that not only falls within the foregoing range but also falls, in particular, within the range of at least 1.1 times the area of the semiconductor light-emitting device LE1, more desirably at least 1.2 times.

Considering the space-saving by minimizing the outside dimensions of the semiconductor-light-emitting-device-mounting member BL and the improvement of the workability of the mounting operation of the semiconductor light-emitting device LE1 with minimizing the waste of the material, it is desirable that the area of the highly heat-dissipative member 1 including the device-mounting area 10a be in the range of 1.5 to 10 times the area of the semiconductor light-emitting device LE1, more desirably 2 to 7 times, preferably 3 to 5 times.

As described above, the area of the semiconductor light-emitting device LE1 is used as the reference for specifying the areas of the device-mounting area 10a and the highly heat-dissipative member 1. When one semiconductor light-emitting device LE1 is mounted on one device-mounting area 10a, the area of the device is used as the reference. When two or more devices are used, the sum of the areas of the individual devices is used as the area of the semiconductor light-emitting device LE1 to specify the areas of the device-mounting area 10a and the highly heat-dissipative member 1.

It is desirable that the highly heat-dissipative member 1 have a thickness of 0.1 to 1 mm, more desirably 0.2 to 0.5 mm, considering the minimizing of the volume of the semiconductor-light-emitting-device-mounting member BL with sufficiently securing the strength.

As described earlier, considering (a) the prevention of the warpage in a state in which the frame-shaped member 2 is bonded with the highly heat-dissipative member 1 and (b) the decreasing of the difference in coefficient of thermal expansion between the frame-shaped member 2 and the semiconductor light-emitting device LE1, it is desirable that the frame-shaped member 2 have a coefficient of thermal expansion of at most $10 \times 10^{-6}/°$ C., more desirably in the range of $4 \times 10^{-6}$ to $7 \times 10^{-6}/°$ C. and that the difference in coefficient of thermal expansion between the frame-shaped member 2 and the highly heat-dissipative member 1 be at most $3\times10^{-6}/°$ C., more desirably at most $1\times10^{-6}/°$ C. Furthermore, it is preferable to form the frame-shaped member 2 using the same material as that of the highly heat-dissipative member 1 to completely eliminate the difference in coefficient of thermal expansion. When the highly heat-dissipative member 1 is formed of $Al_2O_3$, it is desirable that the frame-shaped member 2 be also formed of $Al_2O_3$.

As described earlier, it is desirable that the frame-shaped member 2 be formed of a material capable of transmitting the light from the semiconductor light-emitting device LE1. More specifically, it is desirable that the frame-shaped member 2 be formed of glass having an internal transmittance of at least 90% to light having a wavelength as short as at most 400 nm. Considering this requirement and the above-described decreasing of the difference in coefficient of thermal expansion, it is desirable that not only be the highly heat-dissipative member 1 formed of any of the insulating ceramic materials such as AlN, $Al_2O_3$, SiC, $Si_3N_4$, BeO, and BN but also the frame-shaped member 2 be formed of, for example, alumina-borosilicate glass having a coefficient of thermal expansion of $1\times10^{-6}$ to $8\times10^{-6}/°$ C. It is desirable that the alumina-borosilicate glass have a composition of 55 to 65 wt % $SiO_2$, 10 to 20 wt % $Al_2O_3$, and 5 to 15 wt % $B_2O_3$.

It is desirable that the frame-shaped member 2 have a thickness of 0.1 to 1 mm, more desirably 0.2 to 0.5 mm, considering the minimizing of the volume of the semiconductor-light-emitting-device-mounting member BL with sufficiently securing the strength.

The highly heat-dissipative member 1 and the frame-shaped member 2 are bonded with each other through at least one resin-based adhesive layer to form a unified body form a uniform body.

As the adhesive, various adhesives may be used. However, the adhesive is required to have sufficient heat resistance against, for example, (a) the heat history given by the soldering or a similar operation when the semiconductor light-emitting device LE1 is mounted on the device-mounting area 10a and when the light-emitting-diode-constituting member LE2 is mounted on the mounting portion 7a of the package 7 and (b) the heat generated by the semiconductor light-emitting device LE1 at the time of the light emission. The types of adhesive having such a high heat resistance include epoxy-based-, polyimide-based-, polyamideimide-based-, polyetherimide-based-, polyethersulfone-based-, and liquid-crystal-polymer-based-adhesives.

Of these, considering the capability to sufficiently withstand the above-described heat history and the like, it is desirable to use an adhesive having a glass transition temperature of at least 200° C. or a heat decomposition temperature of at least 260° C. In addition, in view of the handling, it is desirable to use a thermoplastic-resin-based adhesive, which has basically no pot life, such as a polyamideimide-based-adhesive.

When these resin-based adhesives are used to bond the highly heat-dissipative member 1 and the frame-shaped member 2, the following methods can be employed, for example: (a) First, the adhesive is dissolved or dispersed in a proper solvent to form a paste. The paste is applied to the bonding face of at least one of the two members by screen printing method. Then, the applied paste is dried to solidify. (b) First, the adhesive is formed to the shape of a sheet. The sheet is sandwiched between the bonding faces of the two members. Then, the sheet is pressed under a heated condition.

As described above, in a case where the frame-shaped member 2 formed of a material capable of transmitting the light from the semiconductor light-emitting device LE1 is bonded with the highly heat-dissipative member 1 through the adhesive layer 3, when a reflective layer is formed on the frame-shaped member 2's surface to be bonded with the highly heat-dissipative member 1, the luminous efficiency can be further increased.

In the semiconductor-light-emitting-device-mounting member BL of this example, the electrode layers 41 and 42 of the highly heat-dissipative member 1 are covered by the adhesive layer 3 at the place where the frame-shaped member 2 is bonded. Consequently, if the above-described reflective layer is not formed, the light-reflecting area of the electrode layers 41 and 42 is decreased by the area of the adhesive layer 3. On the other hand, when the reflective layer is provided on the frame-shaped member 2's surface to be bonded, the reflective layer can compensate the loss of the light-reflecting area, thereby increasing the luminous efficiency.

The reflective layer can be formed of various metals, as with the below-described electrode layers 41 to 53 and connecting layers 6. In particular, it is desirable to use aluminum, which has good reflectivity to light having a short wavelength. Considering the increasing of the reflection efficiency of light by the reflective layer, it is desirable that the frame-shaped member 2's surface to be bonded with the highly heat-dissipative member 1 be finished with the smoothest possible degree to form the reflective layer.

The electrode layers 41 to 53 and the connecting layers 6, which are formed on the main surface 10, the outside-connecting surface 11, and the chamfers of the side face 12, can all be formed in the shape of a layer by using various well-known highly electrically conductive metal materials, for example. The electrode layers 41 to 53 and the connecting layers 6 can be formed in a single-layer structure or a multiple-layer structure having two or more layers by various metalizing methods, such as the wet plating method and the physical deposition method including the vacuum deposition method and sputtering method.

Of these, in a case where the wet plating method is employed to form the electrode layers 41 to 53 and the connecting layers 6, in order to form them on the corresponding surfaces of the highly heat-dissipative member 1 with high adhesion with the help of an anchoring effect, it is desirable that in the highly heat-dissipative member 1, at least the surfaces for forming the foregoing layers have a centerline average roughness, Ra, of 0.1 to 1 μm.

In a case where the physical deposition method is employed, particularly considering the functioning of the surfaces of the electrode layers 41 and 42 as the above-described reflective surface, it is desirable that in the highly heat-dissipative member 1, at least the surface for forming the foregoing layers have a center-line average roughness, Ra, of at most 0.1 μm.

To control the center-line average roughness, Ra, of the surface of the highly heat-dissipative member, various well-known polishing methods may be employed.

With the wet plating method, a metal film having sufficient thickness can be formed by one operation. Consequently, the electrode layers 41 to 53 and the connecting layers 6 may be formed in a single-layer structure. Alternatively, a multiple-layer structure may also be formed by stacking an electrically conductive layer that is made of highly electrically conductive metal such as Ag and Au and that has a thickness of 0.1 to 10 μm on an underlying layer composed of one or two layers made of Cu or Ni, for example.

On the other hand, with the physical deposition method, it is desirable that the electrode layers 41 to 53 and the connecting layers 6 be formed in a multiple-layer structure in which a plurality of layers each having their own functions are stacked. For example, the foregoing multiple-layer may have the following structure in this order from the highly heat-dissipative member 1:

(a) an adhesive layer that is made of Ti, Cr, NiCr, Ta, or a compound thereof, for example, and that has high adhesion with ceramic;

(b) a diffusion-preventing layer that is made of Pt, Pd, Cu, Ni, Mo, or NiCr, for example, and that has a function of preventing the diffusion of the metal used to form the below-described electrically conductive layer; and (c) a surface layer that is made of Ag, Al, or Au, for example, and that has high electrical conductivity (this layer is also referred to as the electrically conductive layer).

In the above description, it is desirable that the adhesive layer have a thickness of 0.01 to 1.0 µm or so, that the diffusion-preventing layer have a thickness of 0.01 to 1.5 µm or so, and that the surface layer have a thickness of 0.1 to 10 µm or so.

The electrode layers 41 and 42 may be provided on their surface with a reflective layer that is made of Ag, Al, or Al alloy, for example, and that reflects light from the semiconductor light-emitting device LE1 with high reflection efficiency, especially light having a wavelength as short as at most 600 nm. Of these metals, Al is desirable because it has high reflectivity to light having a wavelength as short as at most 450 nm, in particular, so that Al is advantageous in having a capability to increase the luminous efficiency of the semiconductor light-emitting device LE1 that emits light of a short wavelength and that is used to produce white light by combining with a fluorescent body. When one of these metals is used to form the electrically conductive layer, as described above, and is placed as the outermost layer, the reflective layer may be omitted.

The electrode layers 51 to 53 may be provided on their surface with a to-solder-bonding layer that is made of Au, for example, to increase the reliability when they are solder-bonded to, for example, the electrode layers 72a to 72c of the package 7 through the soldering layers SL. However, when Au is used to form the electrically conductive layer, as described above, and is placed as the outermost layer, the to-solder-bonding layer may be omitted.

The pattern formation of the electrode layers 41 to 53 can be performed by the following process, for example: First, a metal mask or a mask formed by photolithography is applied to the surface of the highly heat-dissipative member 1. Then, the exposed surface without being covered by the mask is selectively metalized by the above-described wet plating method, physical deposition method, or the like. The multiple-layer structure of the electrode layers 41 to 53 can be formed by repeatedly metalizing the exposed surface of the highly heat-dissipative member 1 using different metals.

The connecting layers 6 of the example shown in the figures are formed in the below-described production process of the semiconductor-light-emitting-device-mounting member BL of this example. That is, first, through holes are formed in a ceramic plate used as the starting material for producing a plurality of highly heat-dissipative members 1. Second, the inner surface of the through holes is metalized. Then, the ceramic plate is cut by dicing to produce individual highly heat-dissipative members 1. At this moment, the connecting layers 6 are formed.

The connection between the electrode layers 41 and 51 and between the electrode layers 42 and 52 may be performed, for example, through vias formed at any positions in the area of the highly heat-dissipative member 1, in place of the above-described connecting layers 6.

FIGS. 5A to 5E are each a cross-sectional view showing an example of the process for producing the semiconductor-light-emitting-device-mounting member BL of the above-described example. In the production process in the example shown in the figures, as described above, a previously sintered ceramic plate as the starting material for producing a plurality of highly heat-dissipative members 1 and another previously sintered ceramic plate as the starting material for producing a plurality of frame-shaped members 2 are used to produce a plurality of semiconductor-light-emitting-device-mounting members BL.

Figure 6A:
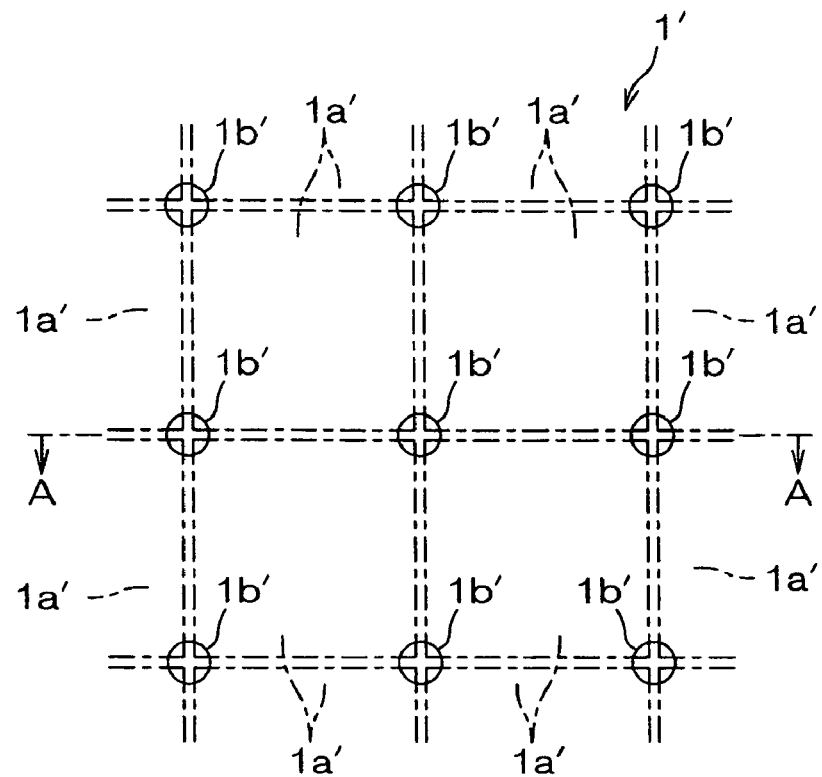
FIG. 6A is a plan view showing a ceramic plate to be used as the starting material for producing highly heat-dissipative members in the above-described production process.

First, as shown in FIGS. 5A and 6A, a previously sintered ceramic plate 1' is prepared that has a size for producing a plurality of highly heat-dissipative members 1 by a cutting operation. The top face and back face of the plate 1' are polished so as to have a specified surface roughness according to the type of the metalizing method, for example. Then, a through hole 1b' is formed at each of the places where four corners of four nearly square areas 1a' meet, which areas correspond to four highly heat-dissipative members 1 and are shown by chain single-dashed lines in FIG. 6A.

Figure 6B:
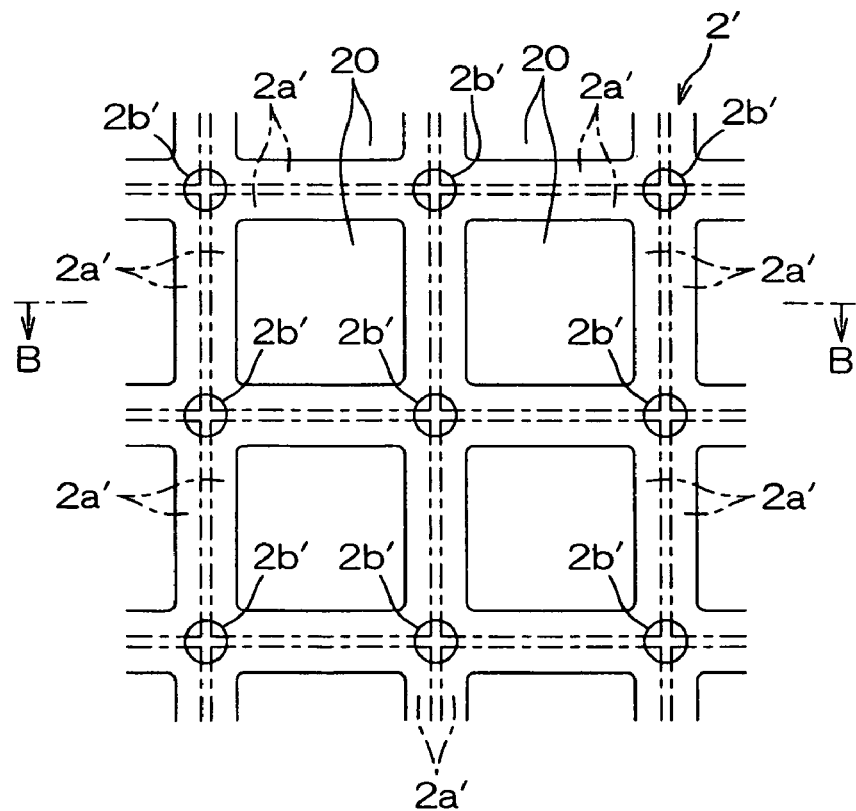
FIG. 6B is a plan view showing a ceramic plate to be used as the staring material for producing frame-shaped members in the above-described production process.

In addition, as shown in FIG. 6B, a previously sintered ceramic plate 2' is prepared that has a size for producing a plurality of frame-shaped members 2 by a cutting operation. The top face and back face of the plate 2' are processed by polishing, for example. A plurality of nearly square areas 2a' corresponding to the individual frame-shaped members 2 are arranged so as to coincide with the pitch of the areas 1a' of the foregoing ceramic plate 1' as shown by chain single-dashed lines in FIG. 6B. Then, a through hole 20 is formed at the center portion of each of the nearly square areas 2a'.

In addition, in the example shown in the figures, a through hole 2b' is formed at each of the places where four corners of four of the above-described areas 2a' meet so that the through hole 2b' can coincide with the foregoing through hole 1b'. The through holes 2b' are provided to align the positions of the areas 1a' of the ceramic plate 1' with those of the areas 2a' of the ceramic plate 2' by aligning the positions of the through holes 2b' and the through holes 1b'. Therefore, in a case where another means is available to align the positions of the areas 1a' and the areas 2a', the through holes 2b' may be omitted.

The hole-making process for forming the through holes 1b' in the ceramic plate 1' and that for forming the through holes 20 and 2b' in the ceramic plate 2' can be performed by various well-known mechanical processing methods, such as cutting and polishing. However, it is desirable to employ the sandblast process using a metal mask or a mask formed by photolithography provided with perforations corresponding to the through holes 1b', 2b' and 20. When such a sandblast process is used, all the through holes 1b' in the ceramic plate 1' can be formed simultaneously in one step. All the through holes 20 and 2b' in the ceramic plate 2' can also be formed similarly. As a result, the processing steps can be simplified to reduce the cost.

In the sandblast process, through holes are produced in a tapered shape. Nevertheless, this shape can be utilized advantageously. More specifically, when the through holes 20 are formed in an inverted tapered shape, i.e., the opening at the side of the ceramic plate 1' is wider, the inverted tapered shape can have a function of preventing the falling out of a fluorescent body and/or a protective resin FR after the through holes 20 are filled with them. Thus, the coming off of the fluorescent body and/or the protective resin FR can be reduced.

Next, as shown in FIG. 5B, the electrode layers 41 and 42 are pattern-formed on the top face of the ceramic plate 1' by the metalizing using a metal mask or a mask formed by photolithography. Similarly, the electrode layers 51 to 53 are pattern-formed on the back face by the metalizing using a metal mask or a mask formed by photolithography. In addition, a metal layer 6' for forming connecting layers 6 is formed on the entire inner surface of each of the through holes 1b'.

The metal layer 6' can be formed concurrently when the electrode layers 41 to 53 are formed on the ceramic plate 1' either by the wet plating method for directly forming them on both the top and back faces at the same time or by the pattern formation method for forming them on one face individually, for example. In this case, when the electrode layers 41 to 52 are pattern-formed so as to reach the opening of the through hole 1b', they can be unitarily formed with the metal layer 6', as can be seen in the figure. Thus, the processing steps can be simplified to reduce the cost.

In a case where the electrode layers 41 to 53 are formed by the physical deposition method, when the sputtering method is employed as the physical deposition method, the inner surface of the through hole 1b' can also be metalized concurrently. The physical deposition method may be combined with the wet plating method.

Next, as shown in FIG. 5C, an adhesive 3' for forming the adhesive layer 3 is applied to the top face of the ceramic plate 1' where the electrode layers 41 and 42 are formed and is dried to solidify. Alternatively, an adhesive 3' having the shape of a sheet is laminated. Subsequently, the ceramic plate 2' is laminated on the adhesive 3' while the alignment is performed using the through holes 1b' and 2b' as described above (see FIG. 5D).

For the sake of clarity, in FIGS. 5D and 5E, the ceramic plate 1' and the adhesive 3' are shown by the cross section cut by the line A-A in FIG. 6A, and the ceramic plate 2' is shown by the cross section cut by the line B-B in FIG. 6B.

Next, the ceramic plates 1' and 2' are pressed toward each other+s face under a heated condition to melt the adhesive 3'. Then, the assembly is cooled to solidify the adhesive 3', so that the two plates are bonded to form a unified body.

Subsequently, as shown by the broken lines in FIG. 5E, the foregoing laminated body is cut into individual areas by dicing at the boundary portions between the areas 1a' and 2a' (the boundary portions are the areas between the two adjacent chain single-dashed lines shown in FIGS. 6A and 6B). Thus, the semiconductor-light-emitting-device-mounting member BL of this example shown in FIGS. 1 to 4 can be produced.

At this moment, the metal layer 6' in the through hole 1b' is divided into four sections to form the above-described connecting layers 6 at the chamfer provided at the four corners of the square side face 12 of the highly heat-dissipative member 1.

As explained earlier, the light-emitting-diode-constituting member LE2 having a structure shown in FIG. 7 can be obtained by the following process. First, the semiconductor light-emitting device LE1 is mounted on the device-mounting area 10a of the main surface 10 of the highly heat-dissipative member 1 of the semiconductor-light-emitting-device-mounting member BL of this example, which is produced by the foregoing process. Then, the inside space of the frame-shaped member 2 is filled with a fluorescent body and/or a protective resin FR to seal the semiconductor light-emitting device LE1.

As the protective resin to seal the semiconductor light-emitting device LE1, various well-known protective resins may be used, such as epoxy-based- and silicone-based-resins. In particular, considering the resistance to heat and ultraviolet rays, it is desirable to use silicone resin. The types of the fluorescent body include various well-known fluorescent bodies capable of producing white light by combining with the semiconductor light-emitting device LE1 that emits light having a wavelength as short as at most 600 nm, desirably 450 nm, for example. The semiconductor light-emitting device LE1 may also be sealed by a laminated structure in which a protective resin covers an underlying fluorescent body.

The foregoing light-emitting-diode-constituting member LE2 can be used as a final form of a light-emitting-diode device. For example, a surface light-emitting body can be constituted by mounting a plurality of light-emitting-diode-constituting members LE2 on a substrate.

The light-emitting diode LE3 shown in FIG. 8 can be obtained by the following process. First, the light-emitting-diode-constituting member LE2 is mounted on the mounting portion 7a provided on the bottom surface of the recessed portion 7b of the package 7 shown in FIG. 8, in which the bottom surface is in a position opposite to the opening 7c. The opening 7c is closed by a sealing cap or a lens LS formed of a material capable of transmitting the light from the semiconductor light-emitting device LE1.

The package 7 in the example shown in the figure is constituted of (a) a substrate 70 provided with the above-described mounting portion 7a by forming the earlier-described lead-use electrode layers 72a and 72b and the electrode layer 72c on the top surface in the figure and (b) a reflecting member 71 that is placed on the substrate 70 to be unified with it and that has an inside space for forming the foregoing recessed portion 7b. The inside space of the reflecting member 71 is formed so as to have a shape extending toward outside from the mounting portion 7a to the opening 7c (a conical shape). The inner surface of the inside space is formed as a reflecting surface 71a. The light from the semiconductor light-emitting device LE1 is reflected from the reflecting surface 71a and the surfaces of the electrode layers 72a and 72b toward the opening 7c. Thus, the light can be emitted to the outside of the package 7 through the lens LS with increased efficiency.

As the substrate 70, a substrate having electrically insulating quality and resistance to heat, such as a ceramic substrate or a glass-epoxy substrate is used. As for the reflecting member 71, in order to reflect the light from the semiconductor light-emitting device LE1 with increased efficiency, as described above, the entire body or at least the reflecting surface 71a is formed of metal.

Figure 9:
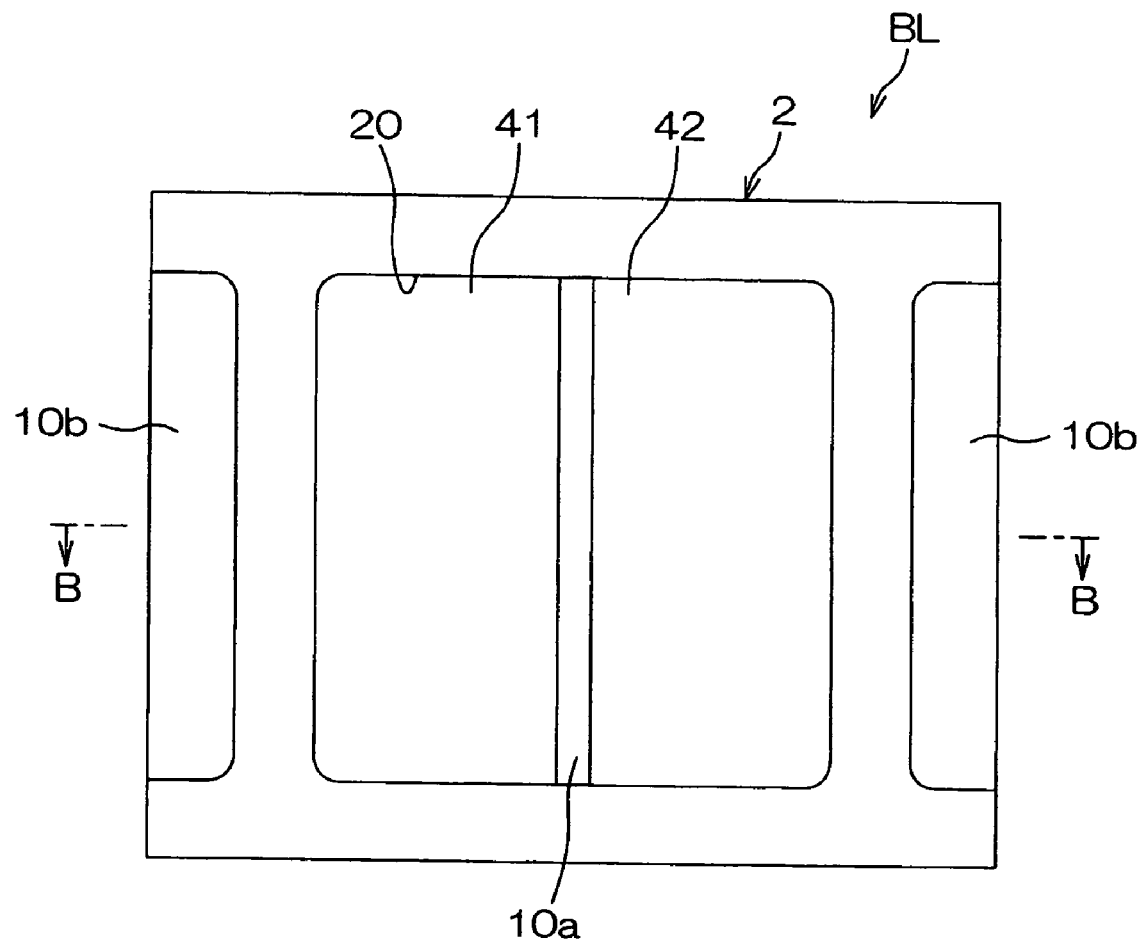
FIG. 9 is a plan view showing another example of the embodiment of the semiconductor-light-emitting-device-mounting member of the present invention.
Figure 10:
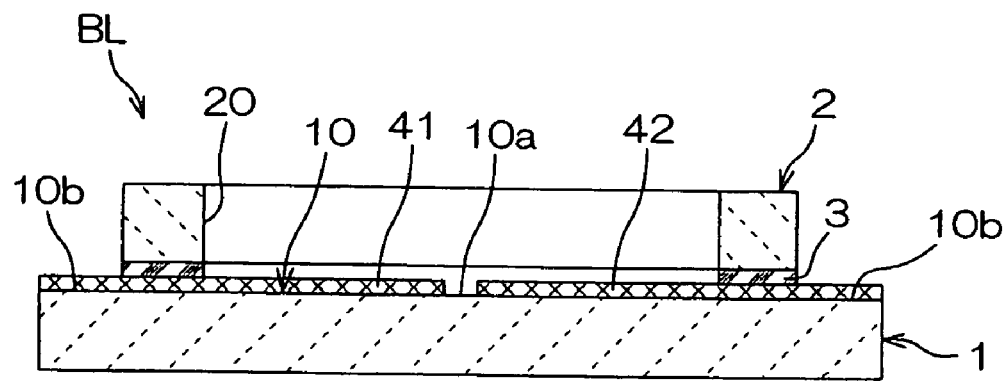
FIG. 10 is a view showing the cross section cut by the line B-B in FIG. 9.
Figure 11:
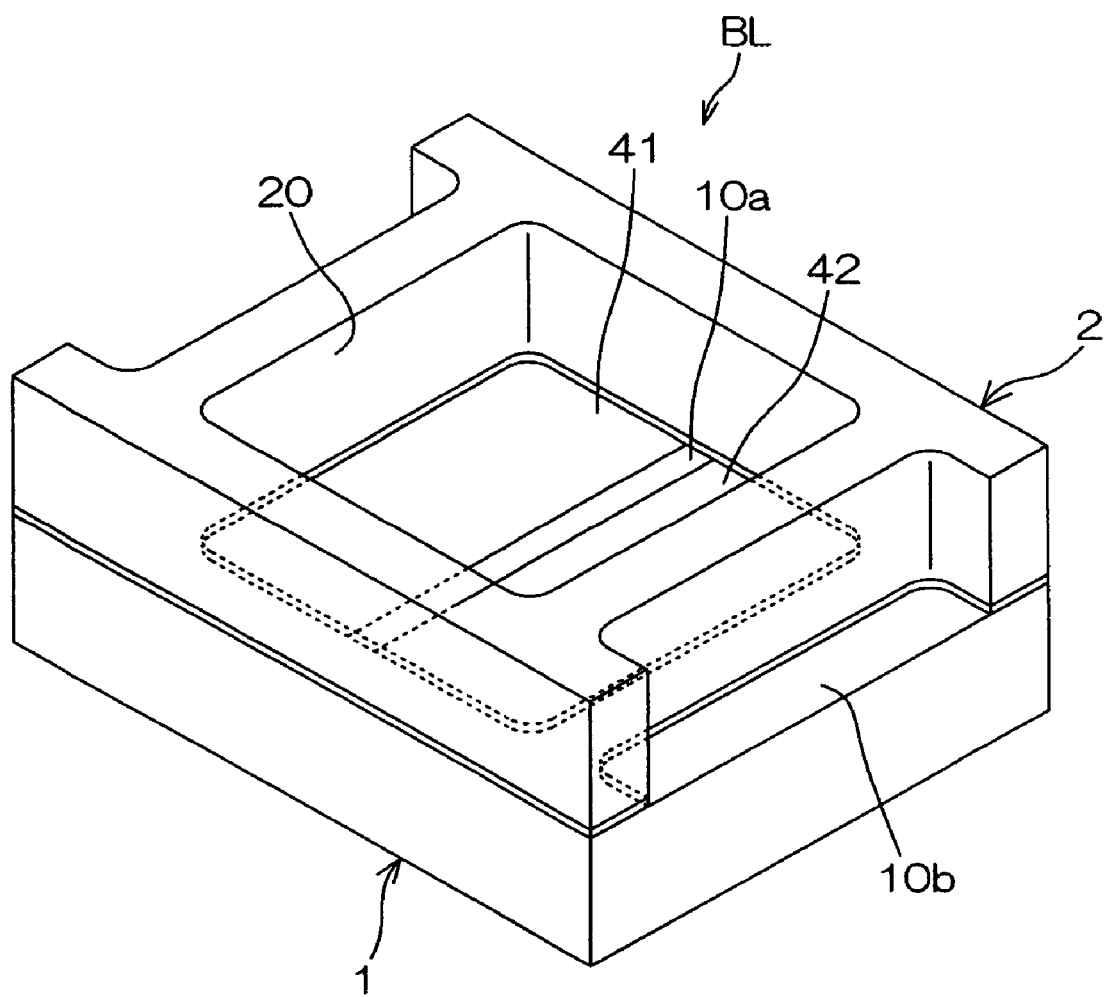
FIG. 11 is a perspective view showing the entire semiconductor-light-emitting-device-mounting member of the above-described example.

FIGS. 9 to 11 are diagrams showing a modified example of the semiconductor-light-emitting-device-mounting member BL of the present invention. As shown in these figures, the semiconductor-light-emitting-device-mounting member BL of this example is the same as that of the previous example, except the following features. (a) The highly heat-dissipative member 1 has a rectangular shape when viewed from above. (b) Its main surface 10 has areas 10b, for connecting with other members, at both the right and left outsides of the frame-shaped member 2+s portion having a square shape when viewed from above. (c) To be used also as an electrode layer for connecting with another member, each of the electrode layers 41 and 42 on the main surface 10 is extended from the device-mounting area 10a, which is exposed to the outside through the through hole 20 of the frame-shaped member 2, to the area 10b via the underside of the frame-shaped member 2.

More specifically, the semiconductor-light-emitting-device-mounting member BL has a structure in which the highly heat-dissipative member 1 and the frame-shaped member 2, both of which are formed of a previously sintered ceramic material such as AlN, are laminated through at least one adhesive layer 3, for example. The electrode layers 41 and 42 are pattern-formed on the main surface 10 of the highly heat-dissipative member 1 by a well-known metalizing method, for example.

The semiconductor-light-emitting-device-mounting member BL is produced, as in the previous example, by using a previously sintered ceramic plate as the starting material for producing a plurality of highly heat-dissipative members 1 and another previously sintered ceramic plate as the starting material for producing a plurality of frame-shaped members 2.

As described above, the semiconductor-light-emitting-device-mounting member BL of this example gives a function of an electrode for connecting with another member to each of the electrode layers 41 and 42 formed on the main surface 10 of the highly heat-dissipative member 1 in order to connect to the semiconductor light-emitting device. Consequently, this structure can eliminate the electrode layers on the outside-connecting surface 11 and the connecting layers for connecting the electrode layers on one side of the highly heat-dissipative member 1 with those on the other side, for example. In other words, this mounting member is advantageous in simplifying the structure.

Figure 12:
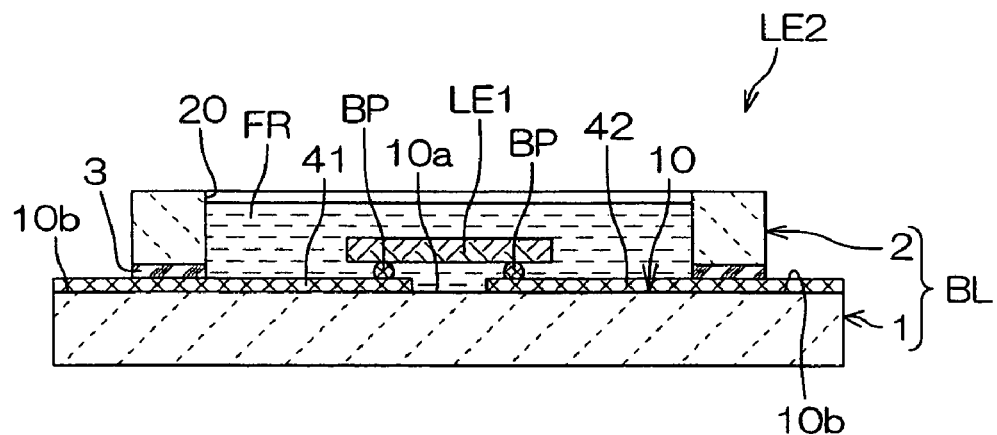
FIG. 12 is a cross-sectional view showing an example of a light-emitting-diode-consulting member formed by using the semiconductor-light-emitting-device-mounting member of the above-described example.

The light-emitting-diode-constituting member LE2 having a structure shown in FIG. 12 can be obtained using the above-described semiconductor-light-emitting-device-mounting member BL by the following process. First, the semiconductor light-emitting device LE1 is mounted on the device-mounting area 10a of the main surface 10 of the highly heat-dissipative member 1 by using gold bumps BP, for example. Then, the inside space of the frame-shaped member 2 is filled with a fluorescent body and/or a protective resin FR to seal the semiconductor light-emitting device LE1.

The foregoing light-emitting-diode-constituting member LE2 can be used as a final form of a light-emitting-diode device, as in the previous example. For example, a surface light-emitting body can be constituted by mounting a plurality of light-emitting-diode-constituting members LE2 on a substrate.

Figure 13:
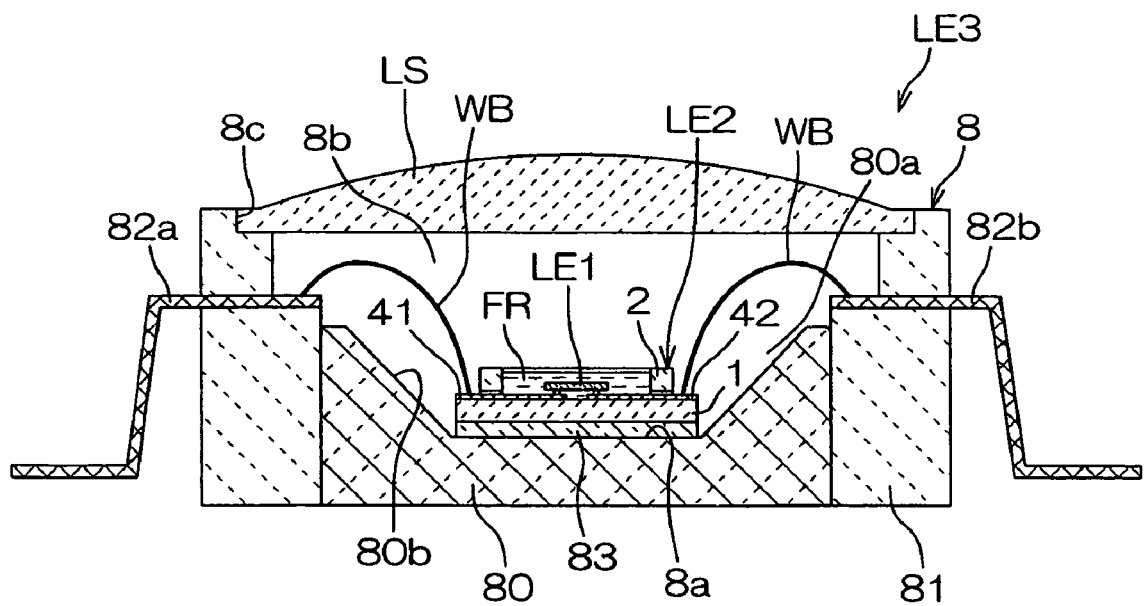
FIG. 13 is a cross-sectional view showing an example of a light-emitting diode constituted by using the light-emitting-diode-constituting member of the above-described example.

Furthermore, the light-emitting diode LE3 shown in FIG. 13 can be obtained by the following process. First, the above-described light-emitting-diode-constituting member LE2 is mounted on the mounting portion 8a provided on the bottom surface of the recessed portion 8b of the package 8 shown in FIG. 13, in which the bottom surface is in a position opposite to the opening 8c. The opening 8c is closed by a sealing cap or a lens LS formed of a material capable of transmitting the light from the semiconductor light-emitting device LE1.

In this example, the light-emitting-diode-constituting member LE2 is mounted on the mounting portion 8a of the package 8 by the following process. First, the highly heat-dissipative member 1 is mounted on the mounting portion 8a through the bonding layer 83 sandwiched between the outside-connecting surface 11 of the member 1 and the mounting portion 8a (the bonding layer 83 is made of adhesive, for example). The electrode layers 41 and 42 extended to the above-described areas 10b are electrically connected through bonding wires WB to a pair of outgoing leads 82a and 82b, respectively, provided in the package 8.

The package 8 in the example shown in the figure is constituted of (a) a reflecting member 80 that is provided with the foregoing mounting portion 8a on the bottom surface and that has a recessed portion 80a having a shape extending toward outside from the mounting portion 8a to the opening 8c (a conical shape), (b) a tubular frame body 81 that is bonded with the reflecting member 80 so as to surround its outer circumference to be unified with it and that has one end forming the opening 8c of the recessed portion 8b, and (c) the above-described leads 82a and 82b provided at both the right and left sides of the frame body 81, as shown in the figure, so as to penetrate the frame body 81. In addition, the inner surface of the recessed portion 80a is formed as a reflecting surface 80b. The light from the semiconductor light-emitting device LE1 is reflected from the reflecting surface 80b toward the opening 8c. Thus, the light can be emitted to the outside of the package 8 through the lens LS with increased efficiency.

As for the reflecting member 80, in order to reflect the light from the semiconductor light-emitting device LE1 with increased efficiency, as with the previous example, the entire body or at least the reflecting surface 80b is formed of metal. As the frame body 81, a resin or ceramic frame body is used to insulate the pair of leads 82a and 82b.

Figure 14:
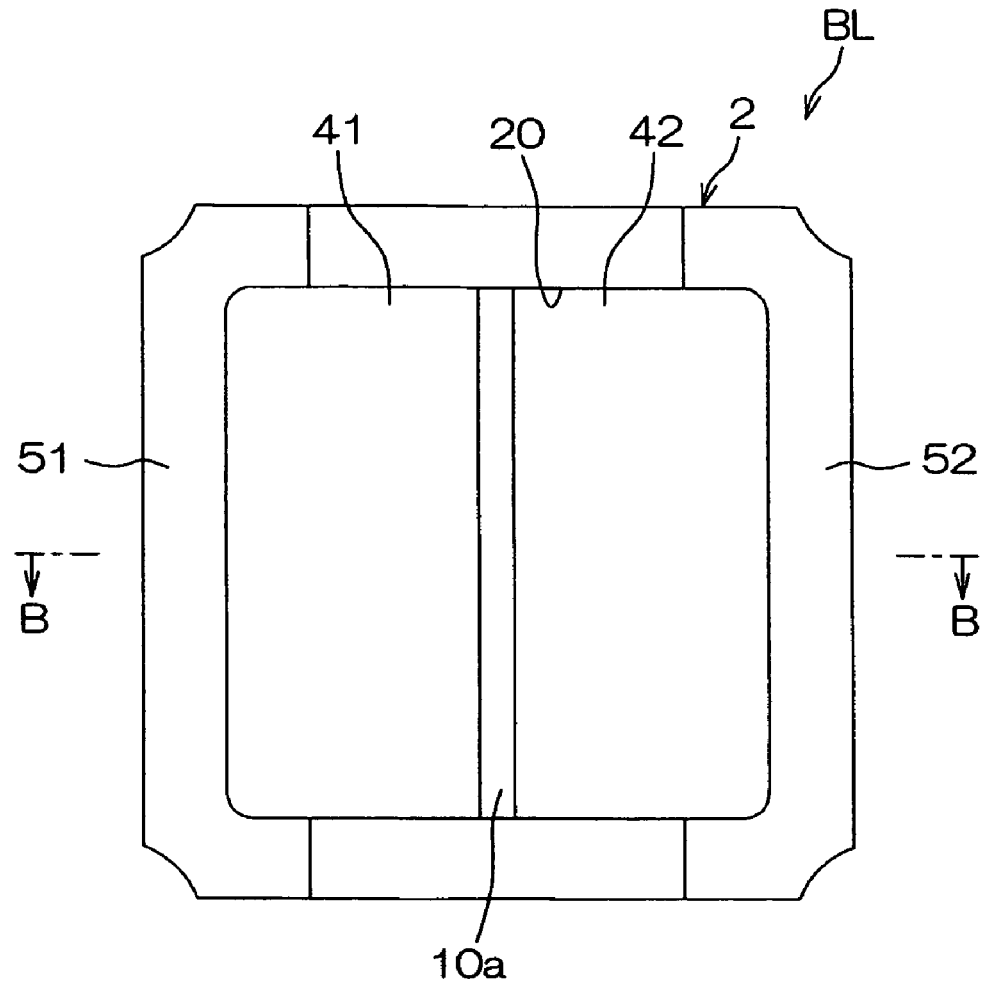
FIG. 14 is a plan view showing yet example of the embodiment of the semiconductor-light-emitting-device-mounting member of the present invention.
Figure 15:
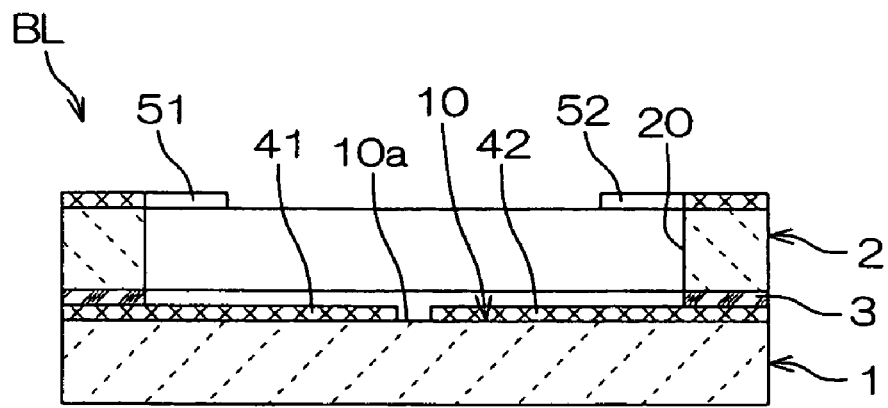
FIG. 15 is a view showing the cross section cut by the line B-B in FIG. 14.
Figure 16:
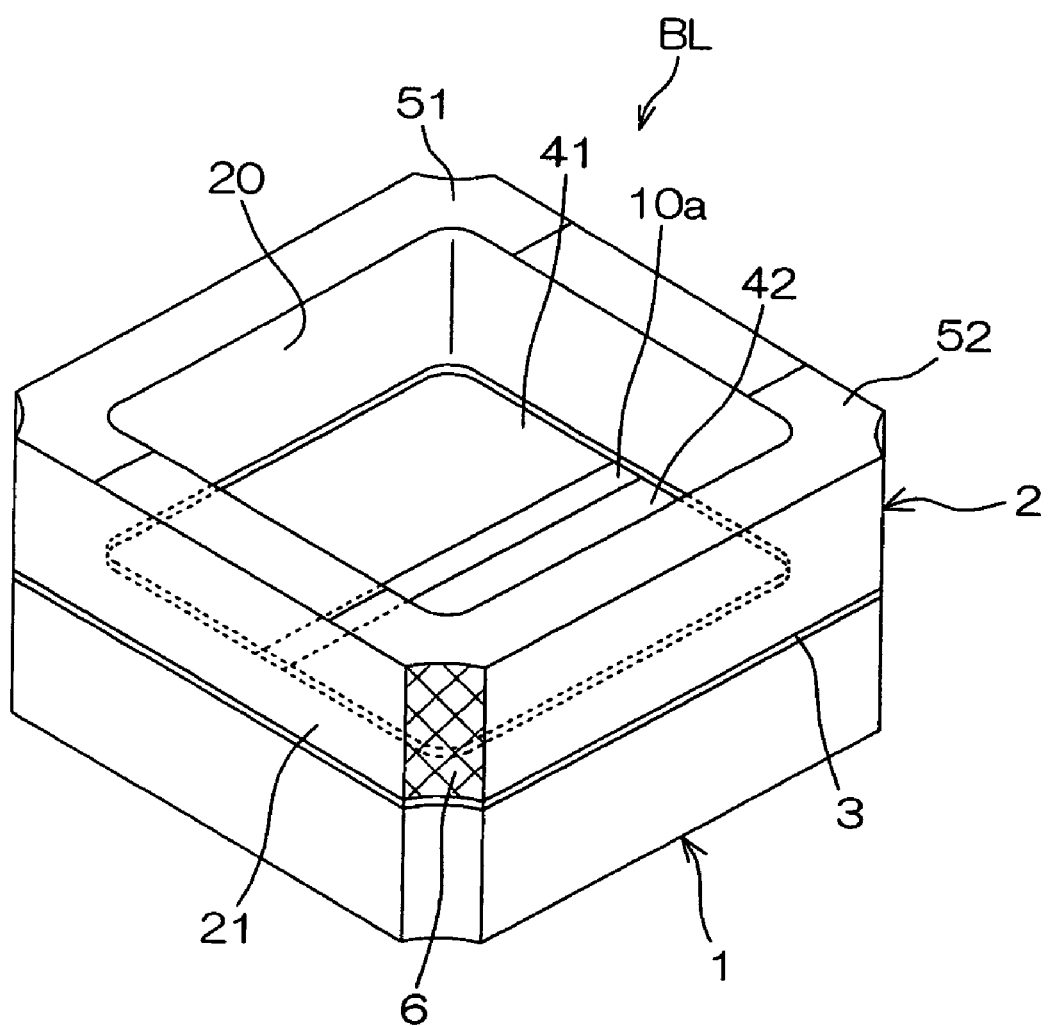
FIG. 16 is a perspective view showing the entire semiconductor-light-emitting-device-mounting member of the above-described example.

FIGS. 14 to 16 are diagrams showing another modified example of the semiconductor-light-emitting-device-mounting member BL of the present invention. As shown in these figures, the highly heat-dissipative member 1 and the frame-shaped member 2 both constituting the semiconductor-light-emitting-device-mounting member BL have the same shape as that of the example shown in FIGS. 1 to 4.

The difference with the previous example is that (a) the electrode layers 51 and 52 for connecting with other members are formed on the top surface of the frame-shaped member 2 and (b) as shown by a mesh pattern in FIG. 16, the connecting layers 6 are formed at the four chamfers provided at the four corners of the square side face 21 of the frame-shaped member 2. The other features are the same as those of the previous example.

More specifically, the semiconductor-light-emitting-device-mounting member BL has a structure in which the highly heat-dissipative member 1 and the frame-shaped member 2, both of which are formed of a previously sintered ceramic material such as AlN, are laminated through at least one adhesive layer 3, for example. The electrode layers 41 to 52 are pattern-formed on the main surface 10 of the highly heat-dissipative member 1 and on the top surface of the frame-shaped member 2 by a well-known metalizing method, for example.

The semiconductor-light-emitting-device-mounting member BL is produced, as in the previous example, by using a previously sintered ceramic plate as the starting material for producing a plurality of highly heat-dissipative members 1 and another previously sintered ceramic plate as the starting material for producing a plurality of frame-shaped members 2.

In this case, the connecting layers 6 are formed by the following process. First, through holes are formed in a ceramic plate used as the starting material for producing a plurality of frame-shaped members. Second, metal layers are formed on the inner surface of the through holes at the same time when the electrode layers 51 and 52 are formed. Then, the metal layers are divided into the connecting layers 6 when the individual semiconductor-light-emitting-device-mounting members BL are cut by dicing.

The connection between the electrode layers 41 and 51 and between the electrode layers 42 and 52 may be performed, for example, through vias formed at any positions in the area of the frame-shaped member 2, in place of the above-described connecting layers 6.

The semiconductor-light-emitting-device-mounting member BL of this example is, as with that of the example shown in FIGS. 1 to 4, advantageous in minimizing its outside dimensions to enable the space saving.

Figure 17:
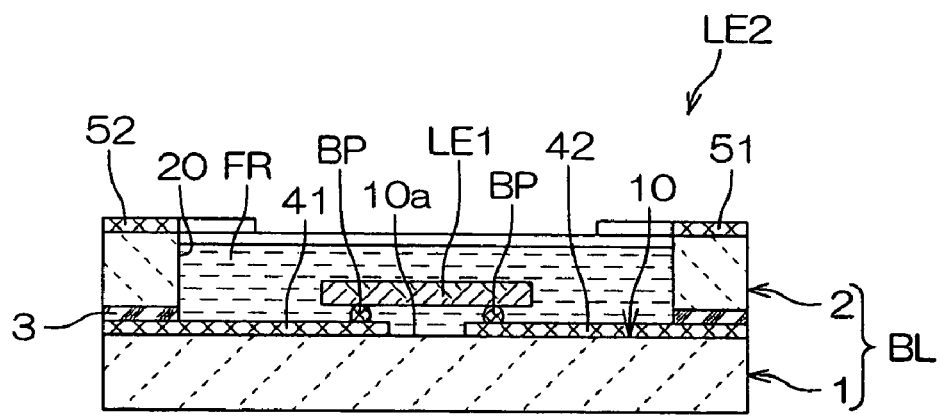
FIG. 17 is a cross-sectional view showing an example of a light-emitting-device-mounting member of the above-described example.

The light-emitting-diode-constituting member LE2 having a structure shown in FIG. 17 can be obtained using the above-described semiconductor-light-emitting-device-mounting member BL by the following process. First, the semiconductor light-emitting device LE1 is mounted on the device-mounting area 10a of the main surface 10 of the highly heat-dissipative member 1 by using gold bumps BP, for example. Then, the inside space of the frame-shaped member 2 is filled with a fluorescent body and/or a protective resin FR to seal the semiconductor light-emitting device LE1.

The foregoing light-emitting-diode-constituting member LE2 can be used as a final form of a light-emitting-diode device, as in the previous example. For example, a surface light-emitting body can be constituted by mounting a plurality of light-emitting-diode-constituting members LE2 on a substrate.

Figure 18:
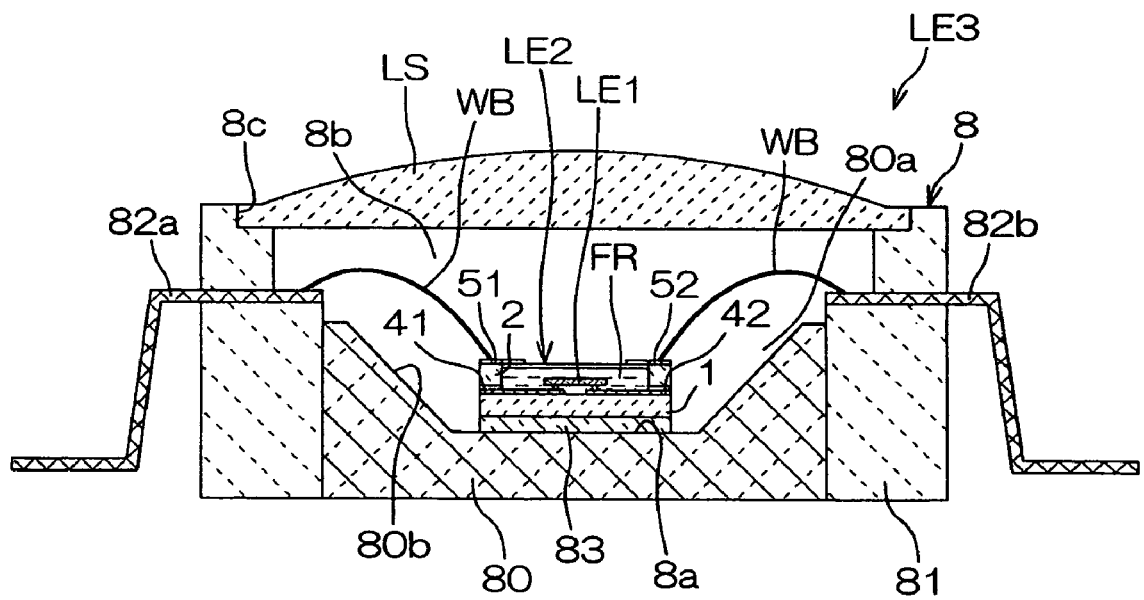
FIG. 18 is a cross-sectional view showing an example of a light-emitting diode constituted by using the light-emitting-diode-constituting member of the above-described example.

Furthermore, the light-emitting diode LE3 shown in FIG. 18 can be obtained by the following process. First, the above-described light-emitting-diode-constituting member LE2 is mounted on the mounting portion 8a provided on the bottom surface of the recessed portion 8b of the package 8 shown in FIG. 18 (which is the same as that shown in FIG. 13), in which the bottom surface is in a position opposite to the opening 8c. The opening 8c is closed by a sealing cap or a lens LS formed of a material capable of transmitting the light from the semiconductor light-emitting device LE1.

The mounting method is also similar. That is, the light-emitting-diode-constituting member LE2 is mounted on the mounting portion 8a of the package 8 by the following process. First, the highly heat-dissipative member 1 is mounted on the mounting portion 8a through the bonding layer 83 sandwiched between the outside-connecting surface 11 of the member 1 and the mounting portion 8a (the bonding layer 83 is made of adhesive, for example). The electrode layers 51 and 52 formed on the top surface of the frame-shaped member 2 are electrically connected through bonding wires WB to a pair of outgoing leads 82a and 82b, respectively, provided in the package 8.

The constitution of the present invention is not limited to that of the examples shown in the figures explained above and can be modified variously in its design within the range in which no alteration is made to the purport of the present invention.

The invention claimed is:

1. A semiconductor-light-emitting-device-mounting member for mounting a semiconductor light-emitting device, the member comprising:
   (a) a highly heat-dissipative member that has:
      (a1) a one side, referred to as a main surface, on which at least two mutually insulated electrode layers to be connected with a semiconductor light-emitting device are formed to provide a device-mounting area for mounting the semiconductor light-emitting device; and
      (a2) an opposite side, which is referred to as an outside-connecting surface to be connected with another member; and
   (b) a frame-shaped member placed on the main surface of the highly heat-dissipative member bonded with each other through at least one resin-based adhesive layer to form a unified body so as to surround the device-mounting area;
the highly heat-dissipative member having a thermal conductivity of at least 10 W/mK and a coefficient of thermal expansion of at most $10 \times 10^{-6}/°$ C.;
the device-mounting area having an area that is 1.05 to 4 times the area of the semiconductor light-emitting device to be mounted.

2. A semiconductor light-emitting-device-mounting member as defined by claim 1, wherein the device-mounting area has an area that is at most 3 times the area of the semiconductor light-emitting device to be mounted.

3. A semiconductor light-emitting-mounting member as defined by claim 1, wherein the device-mounting area has an area that is at least 1.1 times the area of the semiconductor light-emitting device to be mounted.

4. A semiconductor-light-emitting-device-mounting member as defined by claim 1, wherein the highly heat-dissipative member has an area that is 1.5 to 10 times the area of the semiconductor light-emitting device to be mounted.

5. A semiconductor-light-emitting-device-mounting member as defined by claim 4, wherein the highly heat-dissipative member has an area that is 2 to 7 times the area of the semiconductor light-emitting device to be mounted.

6. A semiconductor-light-emitting-device-mounting member as defined by claim 1, wherein:
   (a) the outside-connecting surface is provided with at least two mutually insulated electrode layers for connecting with other members; and
   (b) each of the at least two mutually insulated electrode layers on the outside-connecting surface is connected individually to each of the at least two mutually insulated electrode layers on the main surface through a connecting layer formed on one place selected from the group consisting of a side face of the highly heat-dissipative member and an inner face of a through hole penetrating through the highly heat-dissipative member.

7. A semiconductor-light-emitting-device-mounting member as defined by claim 6, wherein the percentage of the sum of the areas of the electrode layers provided on the outside-connecting surface accounts for at least 30% of the area of the outside-connecting surface.

8. A semiconductor-light-emitting-device-mounting member as defined by claim 6, wherein the percentage of the sum of the areas of the electrode layers provided on the outside-connecting surface accounts for at least 50% of the area of the outside-connecting surface.

9. A semiconductor-light-emitting-device-mounting member as defined by claim 1, wherein:
   (a) the main surface of the highly heat-dissipative member is provided with areas, for connecting with other members, at the outside of the frame-shaped member; and
   (b) each of the at least two electrode layers on the main surface is extended to one of the areas so as to be used also as an electrode layer for connecting with another member.

10. A semiconductor-light-emitting-device-mounting member as defined by claim 1, wherein:
    (a) the frame-shaped member has a top surface that is provided with at least two mutually insulated electrode layers for connecting with other members; and
    (b) each of the at least two mutually insulated electrode layers on the top surface of the frame-shaped member is connected individually to each of the at least two mutually insulated electrode layers on the main surface through a connecting layer formed on one place selected from the group consisting of a side face of the frame-shaped member and an inner face of a through hole penetrating through the frame-shaped member.

11. A semiconductor-light-emitting-device-mounting member as defined by claim 1, wherein:
    (a) the frame-shaped member has a coefficient of thermal expansion of at most $10 \times 10^{-6}$ /° C.; and
    (b) the difference in coefficient of thermal expansion between the frame-shaped member and the highly heat-dissipative member is at most $3 \times 10^{-6}/°$ C.

12. A semiconductor-light-emitting-device-mounting member as defined by claim 11, wherein the frame-shaped member is formed of a material cap able of transmitting light from the semiconductor light-emitting device.

13. A semiconductor-light-emitting-device-mounting member as defined by claim 12, wherein the frame-shaped member is provided with a reflective layer on its surface to be bonded with the highly heat-dissipative member.

14. A light-emitting-diode-constituting member, comprising:
  (a) a semiconductor-light-emitting-device-mounting member as defined by claim 1;
  (b) a semiconductor light-emitting device mounted on the device-mounting area of the main surface of the highly heat-dissipative member, the device-mounting area being surrounded by the frame-shaped member; and
  (c) at least one of a fluorescent body and a protective resin filling the inside space of the frame-shaped member to seal the semiconductor light-emitting device.

15. A light-emitting diode, comprising:
  (a) a package provided with a recessed portion having a bottom surface and an opening;
  (b) a light-emitting-diode-constituting member as defined by claim 14 being mounted on the bottom surface of the recessed portion; and
  (c) a member selected from the group consisting of a sealing cap and a lens both of which are made of a material capable of transmitting light from the light-emitting-diode-constituting member, the member sealing the opening of the recessed portion.

* * * * *